United States Patent
Van Kampen et al.

(10) Patent No.: US 11,261,084 B2
(45) Date of Patent: Mar. 1, 2022

(54) METHOD OF FORMING A FLEXIBLE MEMS DEVICE

(71) Applicant: Qorvo US, Inc., Greensboro, NC (US)

(72) Inventors: Robertus Petrus Van Kampen, S-Hertogenbosch (NL); Lance Barron, Plano, TX (US); Mickael Renault, San Jose, CA (US); Shibajyoti Ghosh Dastider, Roseville, CA (US); Jacques Marcel Muyango, Rocklin, CA (US); Richard L. Knipe, McKinney, TX (US)

(73) Assignee: QORVO US, INC., Greensboro, NC (US)

( * ) Notice: Subject to any disclaimer, the term of this patent is extended or adjusted under 35 U.S.C. 154(b) by 37 days.

(21) Appl. No.: 16/907,123

(22) Filed: Jun. 19, 2020

(65) Prior Publication Data

US 2020/0399121 A1     Dec. 24, 2020

Related U.S. Application Data

(60) Provisional application No. 62/865,198, filed on Jun. 22, 2019.

(51) Int. Cl.
*B81C 1/00* (2006.01)
*B81B 3/00* (2006.01)

(52) U.S. Cl.
CPC ........ *B81C 1/00444* (2013.01); *B81B 3/0067* (2013.01); *B81C 1/00349* (2013.01); *B81B 2207/11* (2013.01); *B81C 1/00158* (2013.01)

(58) Field of Classification Search
CPC .......................... B81C 1/00349; B81B 3/0067
See application file for complete search history.

(56) References Cited

U.S. PATENT DOCUMENTS

| | | | | |
|---|---|---|---|---|
| 7,402,449 B2 * | 7/2008 | Fukuda | ............... | B81C 1/00246 438/53 |
| 2020/0399115 A1 | 12/2020 | Van Kampen et al. | | |
| 2020/0402755 A1 | 12/2020 | Van Kampen et al. | | |
| 2020/0407214 A1 | 12/2020 | Renault et al. | | |

* cited by examiner

*Primary Examiner* — Moazzam Hossain
(74) *Attorney, Agent, or Firm* — Withrow & Terranova, P.L.L.C.

(57) ABSTRACT

A method of forming a microelectromechanical device wherein a beam of the microelectromechanical device may deviate from a resting to an engaged or disengaged position through electrical biasing. The microelectromechanical device comprises a beam disposed above a first RF conductor and a second RF conductor. The microelectromechanical device further comprises at least a center stack, a first RF stack, a second RF stack, a first stack formed on a first base layer, and a second stack formed on a second base layer, each stack disposed between the beam and the first and second RF conductors. The beam is configured to deflect downward to first contact the first stack formed on the first base layer and the second stack formed on the second base layer simultaneously or the center stack, before contacting the first RF stack and the second RF stack simultaneously.

15 Claims, 24 Drawing Sheets

(ALTERNATIVE)

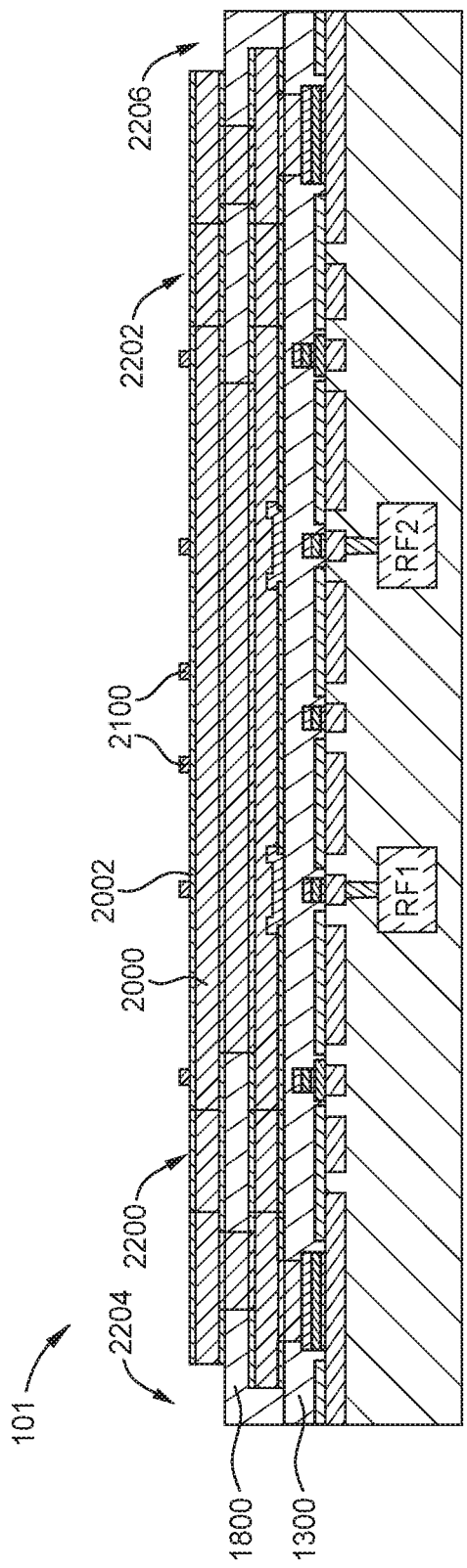
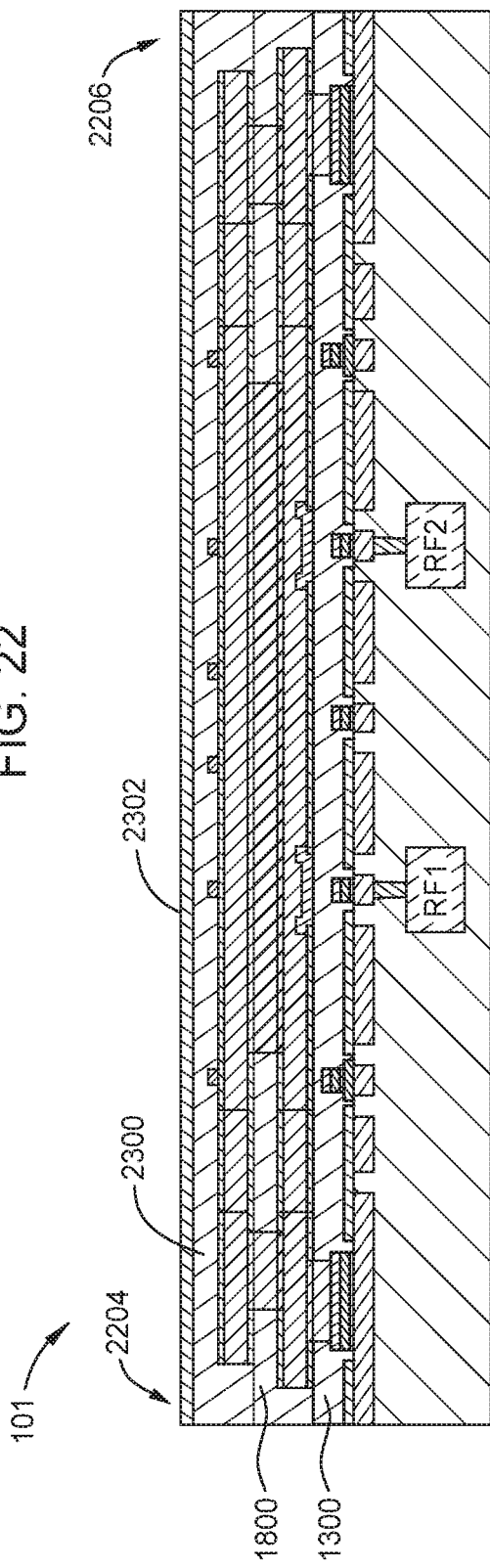

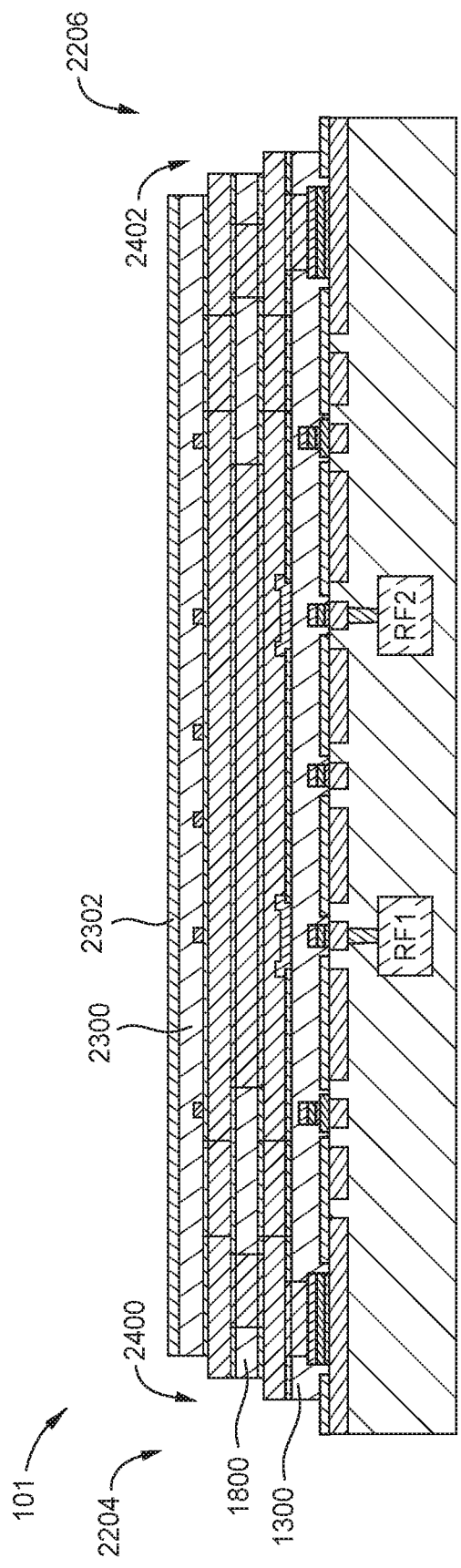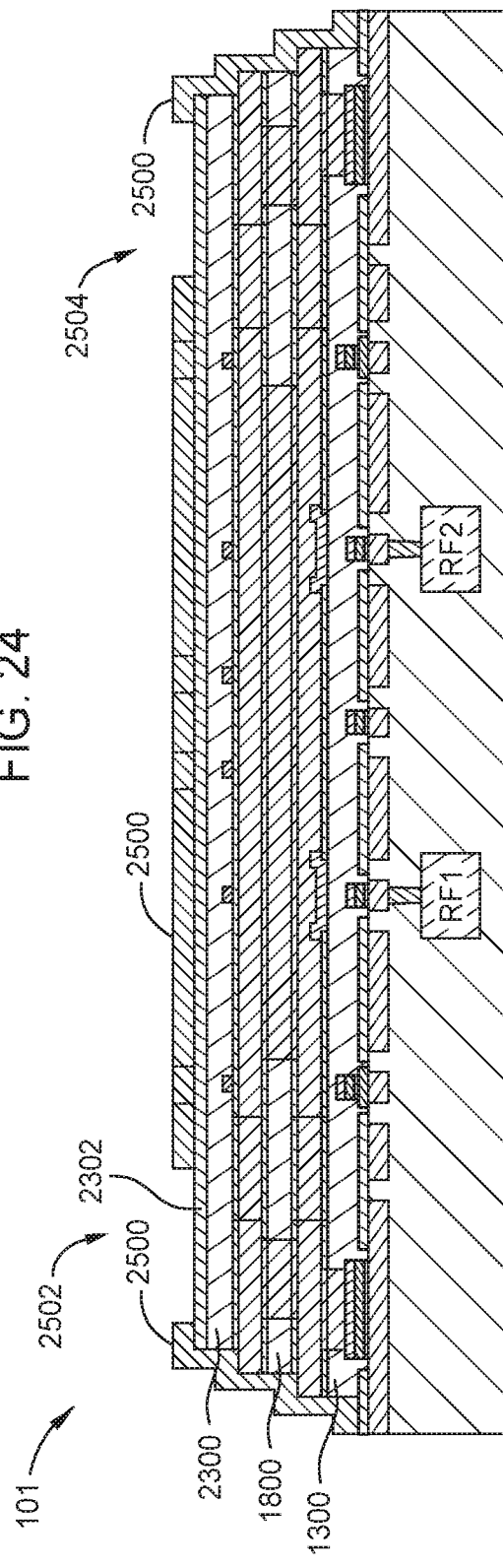

METHOD OF FORMING A FLEXIBLE MEMS DEVICE

RELATED APPLICATIONS

This application claims the benefit of U.S. provisional patent application No. 62/865,198, filed Jun. 22, 2019, the disclosure of which is incorporated herein by reference in its entirety.

This application is related to U.S. patent application Ser. No. 16/907,129, filed Jun. 19, 2020, now U.S. Patent Application Publication No. 2020/0399115 A1, entitled STABLE LANDING ABOVE RF CONDUCTOR IN MEMS DEVICE, which claims the benefit of U.S. provisional application No. 62/865,199 filed Jun. 19, 2019; U.S. patent application Ser. No. 16/907,138, filed Jun. 19, 2020, now U.S. Patent Application Publication No. 2020/0402755 A1, entitled FLEXIBLE MEMS DEVICE HAVING HINGED SECTIONS, which claims the benefit of U.S. provisional application No. 62/865,201 filed Jun. 19, 2019; and U.S. patent application Ser. No. 16/907,162, filed Jun. 19, 2020, now U.S. Patent Application Publication No. 2020/0407214 A1, entitled MEMS DEVICE HAVING UNIFORM CONTACTS, which claims the benefit of U.S. provisional application No. 62/867,195 filed Jun. 26, 2019 and 62/879,185 filed Jul. 26, 2019, the disclosures of which are incorporated herein by reference in their entireties.

FIELD OF THE DISCLOSURE

Embodiments of the disclosure generally relate to electrical structures created through deposition methods. More specifically, aspects of the disclosure relate to methods and resulting microelectromechanical (MEMS) devices for use in electrical circuits.

BACKGROUND

With the advent of microelectronics, manufacturers are challenged to provide solutions to electrical problems that electronics users encounter. Switching of an electronic arrangement from one configuration to another configuration is a common technique in large scale electrical packages. Microelectromechanical switches may be used in many types of applications, from wireless communications to consumer products. As the footprint of consumer products can be very limited, MEMS switches provide advantages that conventional electrical arrangements cannot provide. Microelectromechanical switches can be small; however due to their size, the production of such MEMS switches can be problematic. As such, switching from one electronic configuration to another configuration can become problematic as well.

Therefore, there is a need to manufacture MEMS switches such that the production has a high yield and low defect rate.

There is a further need to provide a method to manufacture MEMS switches in a cost effective manner such that the resulting MEMS switches can be used in a variety of applications, including consumer electronics, without being cost prohibitive.

SUMMARY

A method of forming a microelectromechanical device is disclosed wherein a beam of the microelectromechanical device may deviate from a resting to an engaged or disengaged position through electrical biasing. The microelectromechanical device comprises a beam disposed above a first RF conductor and a second RF conductor. The microelectromechanical device further comprises at least a center stack, a first RF stack, a second RF stack, a first stack formed on a first base layer, and a second stack formed on a second base layer, each stack disposed between the beam and the first and second RF conductors. The beam is configured to deflect downward to first contact the first stack formed on the first base layer and the second stack formed on the second base layer simultaneously or the center stack, before contacting the first RF stack and the second RF stack simultaneously.

In another embodiment, a method for forming a microelectromechanical device comprises forming one or more bottom electrodes on a backplane comprising at least two RF conductors, depositing a bottom dielectric layer over the backplane and the one or more bottom electrodes, etching one or more openings in the bottom dielectric layer, depositing a first base layer and a second base layer onto the one or more openings in the bottom dielectric layer, depositing a plurality of stacks on at least the first and second base layers, above the at least two RF conductors, and between the at least two RF conductors, depositing a first spun layer over an entire surface of all of the layers previously deposited, depositing a first dielectric layer on the first spun layer, removing at least two areas of the first dielectric layer disposed above the at least two RF conductors, depositing at least two beam contact layers on the at least two removed areas of the first dielectric layer, depositing a bottom beam layer over the at least two beam contact layers and the first dielectric layer, depositing a second spun layer on the bottom beam layer, depositing a top beam layer above the second spun layer, depositing a third spun layer over the top beam layer, depositing a partial cavity layer above the third spun layer, depositing a roof dielectric layer over the partial cavity layer, etching one or more release holes through the roof dielectric layer, removing the first spun layer, the second spun layer, and the third spun layer through the one or more release holes, and depositing a seal layer above the roof dielectric layer and within the one or more release holes.

In one embodiment, a microelectromechanical device comprises a backplane comprising at least two RF conductors, a plurality of bottom electrodes disposed on the backplane, a bottom dielectric layer disposed on the plurality of bottom electrodes, the bottom dielectric layer comprising at least two openings, a first base layer and a second base layer disposed on the at least two openings of the bottom dielectric layer, a first stack disposed on the first base layer, the first stack having a first height, a second stack disposed on the second base layer, the second stack having the first height, and at least two RF stacks disposed above the at least two RF conductors. The at least two RF stacks each have a second height that is less than the first height of the first and second stacks. The MEMS device further comprises a center stack disposed between the at least two RF stacks, the center stack having the second height, a beam contact layer disposed above the at least two RF stacks, a bottom beam layer disposed over the beam contact layer, a top beam layer disposed above the bottom beam layer, a partial cavity layer disposed above the top beam layer, and a seal layer disposed above the partial cavity layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 22 is a cross-sectional view of the MEMS device of FIG. 21 with a patterned top beam layer in accordance with an example embodiment of the disclosure.

FIG. 23 is a cross-sectional view of the MEMS device of FIG. 22 having a third spun layer and third deposited dielectric layer deposited thereon in accordance with an example embodiment of the disclosure.

FIG. 24 is a cross-sectional view of the MEMS device of FIG. 23 having etched ends in accordance with an example embodiment of the disclosure.

FIG. 25 is cross-sectional view of the MEMS device of FIG. 24 having a partial cavity layer deposited thereon of the deposited layer in accordance with an example embodiment of the disclosure.

To facilitate understanding, identical reference numerals have been used, where possible, to designate identical elements that are common to the Figures. It is contemplated that elements and features of one embodiment may be beneficially incorporated in other embodiments without further recitation.

DETAILED DESCRIPTION

Figure 1:
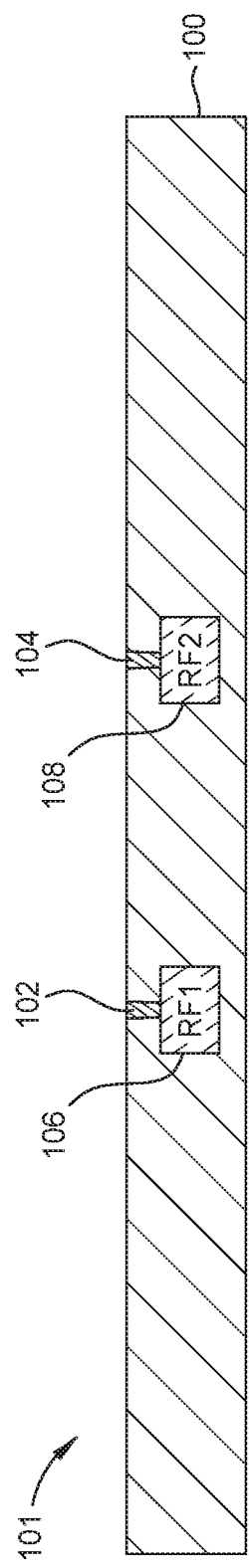
FIG. 1 is a cross-sectional view of a backplane of a MEMS device in accordance with an example embodiment of the disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

A method of forming a microelectromechanical device is disclosed wherein a beam of the microelectromechanical device may deviate from a resting to an engaged or disengaged position through electrical biasing. The microelectromechanical device comprises a beam disposed above a first RF conductor and a second RF conductor. The microelectromechanical device further comprises at least a center stack, a first RF stack, a second RF stack, a first stack formed on a first base layer, and a second stack formed on a second base layer, each stack disposed between the beam and the first and second RF conductors. The beam is configured to deflect downward to first contact the first stack formed on the first base layer and the second stack formed on the second base layer simultaneously or the center stack, before contacting the first RF stack and the second RF stack simultaneously.

Some embodiments will now be described with reference to the figures. Like elements in the various figures will be referenced with like numbers for consistency. In the following description, numerous details are set forth to provide an understanding of various embodiments and/or features. It will be understood, however, by those skilled in the art that some embodiments may be practiced without many of these details and that numerous variations or modifications from the described embodiments are possible. As used herein, the terms "above" and "below", "up" and "down", "upper" and "lower", "upwardly" and "downwardly", and other like terms indicating relative positions above or below a given point or element are used in this description to more clearly describe certain embodiments.

In the description that follows, method steps are disclosed to produce a MEMS device or MEMS switch useful in a variety of applications. The method disclosed comprises various steps of material deposition, etching, and chemical and/or mechanical surface preparation. Various materials, such as silicon dioxide, titanium nitride, and ruthenium, as non-limiting embodiments, are used in production of the MEMS switch. Variations from the materials described may be accomplished for certain applications where alternative materials would produce desired results. Variations from approximate dimensions of various materials removed or deposited are also contemplated, therefore thicker or thinner variations of the description will be understood to be within the methods described.

The methods and apparatus provide for a MEMS device that has a single or multiple beams that are created through various deposition and etching steps to provide a switch that may be switched from a resting state to an "on" state or an "off" state depending on electrical biasing. The beams are created within cavities that are created within the structure. The cavities are created through various material removal techniques wherein portions on the overall structures are removed, with the result being a beam extending inside the cavity. Such MEMS devices can be made such that greater or lesser amounts of bias voltage cause deflection of the beams within the MEMS device. As will be understood, a thicker beam structure would require greater amounts of electrical biasing to move the beam rather than a thinner beam. In the embodiments disclosed, both thicker and thinner beams are contemplated as part of the disclosure. In other embodiments, beams or different sections of beams may be created to create longer effective spans for use. Such longer beams may have supports along the length of the beam to prevent from inadvertent electrical actuation or short circuiting.

A method will be described, in FIGS. 1-30, wherein different steps for making the MEMS device are described. In some figures, alternative methods may be discussed or described. Such alternative methods should not be considered exclusive, as other embodiments may be possible to perform similar functions or produce similar structures.

In some embodiments an "etch" is described. As defined, an etch may be a wet type etching or dry type etching. Such etching removes material to an as-needed or desired profile. Etching may be accomplished through a timed etch, for example, wherein a known amount of material per unit time is removed. In a similar fashion, "patterning" is also described. Patterning may be done through photolithographic methods and layers of different materials that are either photo resistant or not may be used. Thus, where a reactive material is incorporated into an arrangement and that reactive material is exposed to light, the reactive material may be removed from the overall arrangement. In the description that follows, therefore, patterning may apply to both the exposure of materials to a radiation source and subsequent removal of materials from the structures.

In embodiments, materials such as titanium nitride or silicon dioxide are described. Such materials are only examples of materials that may be used in the construction or permanent arrangements described. As examples, different types of "resist" layers may be used that will be incorporated into the permanent structures, while other material layers may include differing dielectric materials. As a result, the express mention of a specific material should only be considered as an example material that may be used in the finalized structures. Furthermore, deposition of these materials may be performed through spinning methods, vapor deposition, or other types of method.

In other embodiments, after etching, cleaning steps may or may not be disclosed. Cleaning methods may be "wet clean" steps of using fluids to remove impurities from the created structures. Other cleaning methods may include more aggressive means for removing materials such as mechanical and or chemical methods. The presence of a specific cleaning step or the non-identification of a specific cleaning step does not necessarily require or eliminate the cleaning step.

FIGS. 1-30 illustrate a sequential sequence of forming a MEMS device 3000, according to one embodiment. FIGS. 31-34 illustrate various embodiments of MEMS devices.

Referring to FIG. 1, a backplane 100 of an arrangement 101 is illustrated. The backplane 100 provides a substrate from which other structures will be constructed in embodiments of the disclosure. The backplane 100 comprises a first radiofrequency (RF) conductor (RF1) 106 recessed into a square via of the backplane 100 with an accompanying via 102 to the surface of the backplane 100. The backplane 100 further comprises a second RF conductor (RF2) 108 recessed into a square via of the backplane 100 and spaced from the RF1 conductor 106. The RF2 conductor 108 has an accompanying via 104 to the surface of the backplane 100. The RF1 conductor 106 and the RF2 conductor 108 may each individually have a thickness and width of about 2 µm to about 3 µm for good RF performance (i.e., low resistance) and run underneath the MEMS-switch (shown in FIG. 30) out to a metal pad (not shown) used for external connection. The RF1 conductor 106 and the RF2 conductor 108 are generated with a standard CMOS metallization process and may comprise aluminum or copper. While not shown, one or more pull-down electrodes may be recessed into square vias in the backplane 100. In such an embodiment, the one or more pull-down electrodes are spaced from the RF1 conductor 106 and the RF2 conductor 108.

After the formation of the RF conductors 106, 108, the RF conductors 106, 108 are covered with a dielectric layer (not shown), which may comprise silicon dioxide, which is subsequently planarized with a CMP process. The vias 102, 104 extending to the surface may be configured with a round or square shape, as non-limiting embodiments, and are created through a plug creation process, resulting in a planar surface upon which the MEMS device is generated in following process steps. A wet clean may be performed on the backplane 100, as necessary, to provide a surface free from foreign materials.

Figure 2:
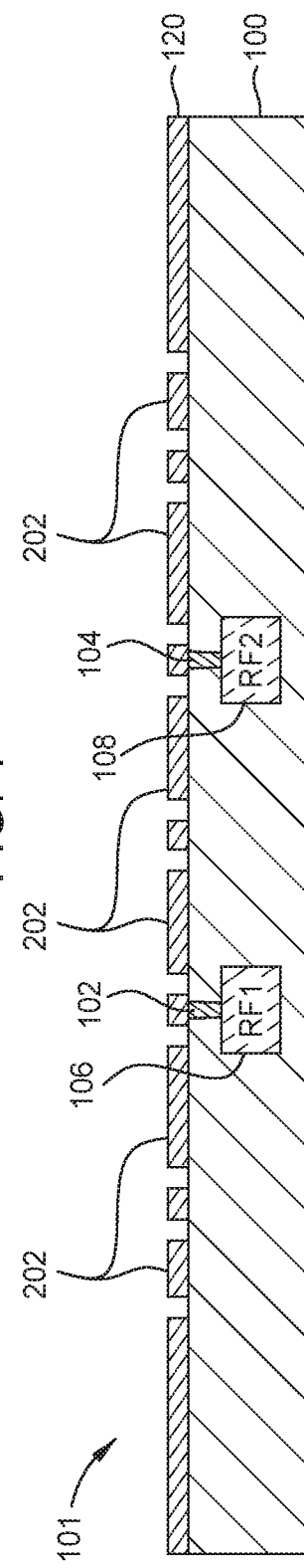
FIG. 2 is a cross-sectional view of the MEMS device of FIG. 1 having a titanium nitride layer deposited thereon in accordance with an example embodiment of the disclosure.

Referring to FIG. 2, a first layer 120 is deposited upon the surface of the backplane 100. The first layer 120 may comprise, as a non-limiting embodiment, titanium nitride (TiN). The first layer 120 may be deposited on the surface of the backplane 100 through a physical vapor deposition (PVD) process or a chemical vapor deposition (CVD) process. After the first layer 120 is deposited, the first layer 120 may be patterned through known processes. The first layer 120 is utilized to create a plurality of bottom electrodes 202, and voltage may be placed upon the plurality of bottom electrodes 202 formed from the first layer 120 such that a beam (described later) may deflect in a downward position.

Figure 3:
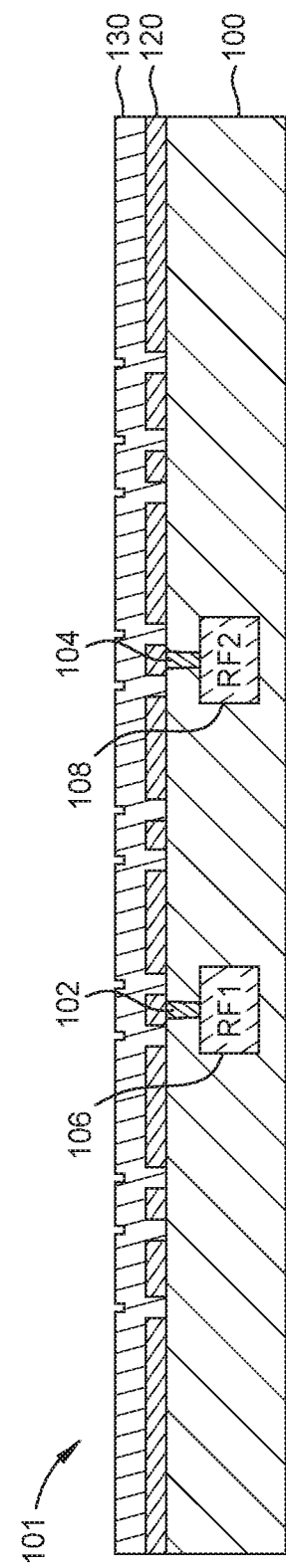
FIG. 3 is a cross-sectional view of the MEMS device FIG. 2 having a silicon dioxide layer deposited thereon in accordance with an example embodiment of the disclosure.

Referring to FIG. 3, an oxide layer 130 is deposited over the first layer 120. The oxide layer 130 may be patterned or unpatterned as necessitated by the design. The oxide layer 130 may comprise silicon dioxide. The oxide layer 130 is a gap-filling layer that fills the gaps between the patterned surface of the first layer 120. Thus, the oxide layer 130 not only forms a separate layer, but also fills in gaps created in the first layer 120.

Figure 4:
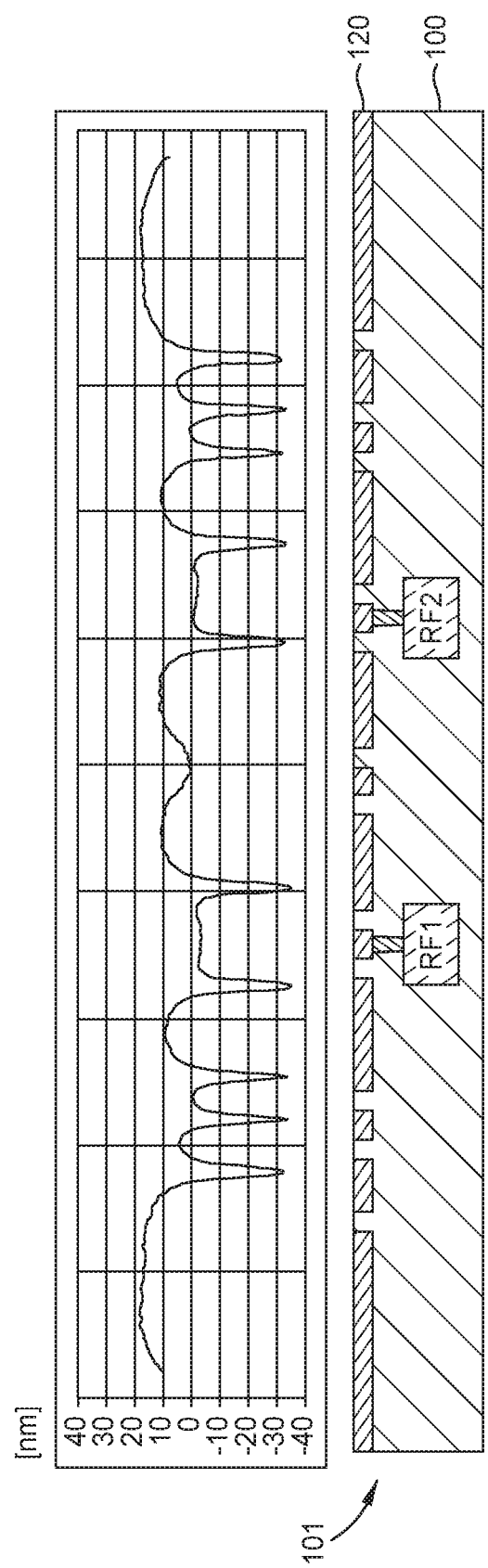
FIG. 4 is a cross-sectional view of the MEMS device of FIG. 3 after a chemical mechanical planarization in accordance with an example embodiment of the disclosure.

Referring to FIG. 4, a chemical mechanical planarization process is then performed on the arrangement 101 provided in FIG. 3. The chemical mechanical planarization process is performed until the titanium nitride of the first layer 120 is exposed through the oxide layer 130. As illustrated at the top of FIG. 4, a varied surface profile may then exist after the processing occurs. To resolve this varied surface profile, referring to FIG. 5, a metal based planarization is performed such that the oxide layer 130 and the first layer 120 form a substantially flat or planar surface. The final profile, illustrated in FIG. 5, is illustrated in the upper portion of FIG. 5, showing a markedly decreased profile variability.

Figure 5:
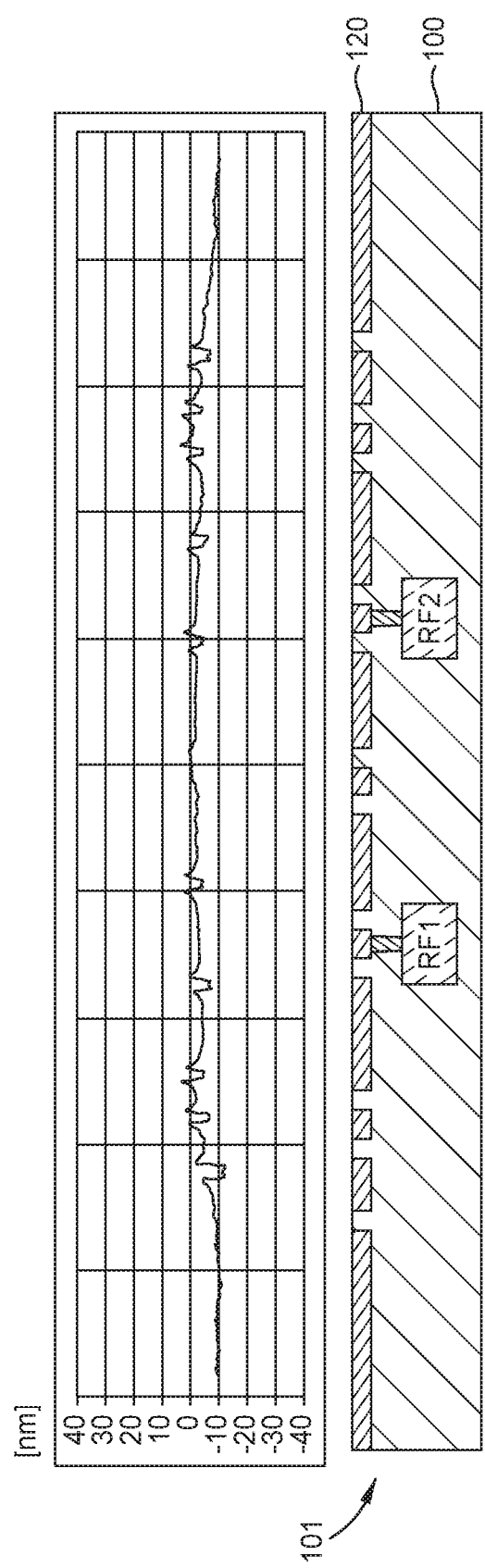
FIG. 5 is a cross-sectional view of the MEMS device of FIG. 4 after a metal chemical mechanical planarization in accordance with an example embodiment of the disclosure.
Figure 6:
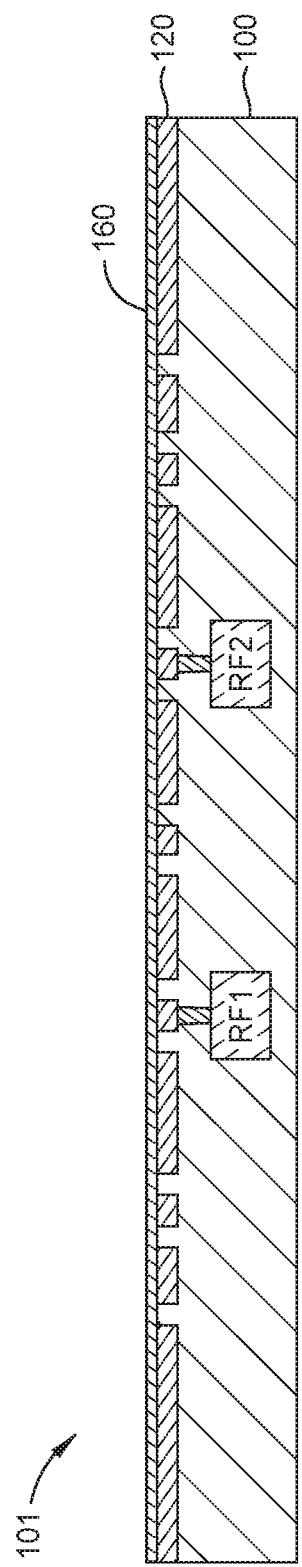
FIG. 6 is a cross-sectional view of the MEMS device of FIG. 5 having a dielectric layer deposited thereon in accordance with an example embodiment of the disclosure.

Referring to FIG. 6, a bottom dielectric layer 160 is deposited on the substantially planar surface provided in FIG. 5. The bottom dielectric layer 160, in a non-limiting embodiment, comprises silicon dioxide. As provided, the bottom dielectric layer 160 is uniform across the length of the backplane 100.

Figure 7:
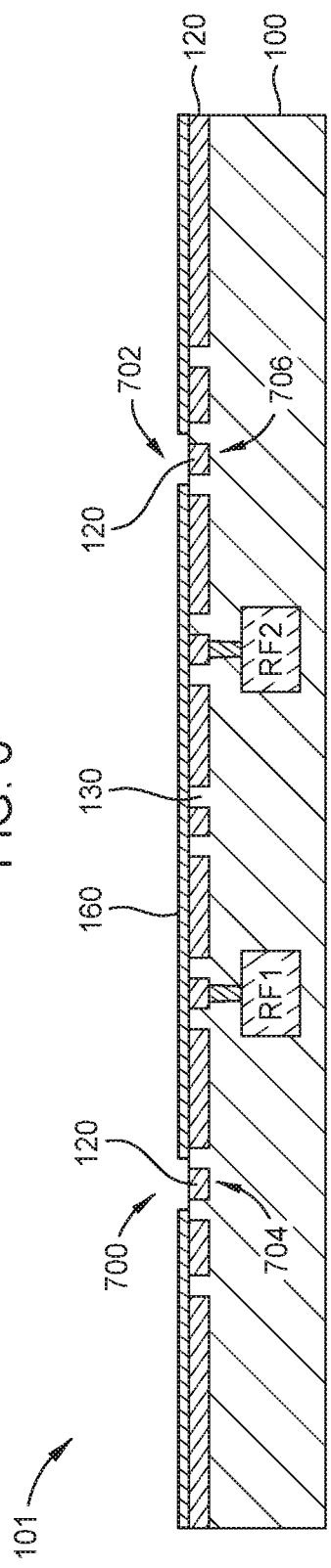
FIG. 7 is cross-sectional view of the MEMS device of FIG. 6 after the dielectric layer has been etched in sections in accordance with an example embodiment of the disclosure.

Referring to FIG. 7, the bottom dielectric layer 160 is etched to create a first opening 700 and a second opening 702 in the bottom dielectric layer 160. The bottom dielectric layer 160 is etched until the first layer 120 and/or oxide layer 130 is exposed through the first opening 700 and the second opening 702. The first opening 700 is disposed over a first portion 704 of the first layer 120 and the second opening is disposed over a second portion 706 of the first layer 120. The first and second openings 700, 702 are unaligned with the RF1 conductor 106 and the RF2 conductor 108. The etching may be a timed oxide etch, as a non-limiting embodiment.

Figure 8:
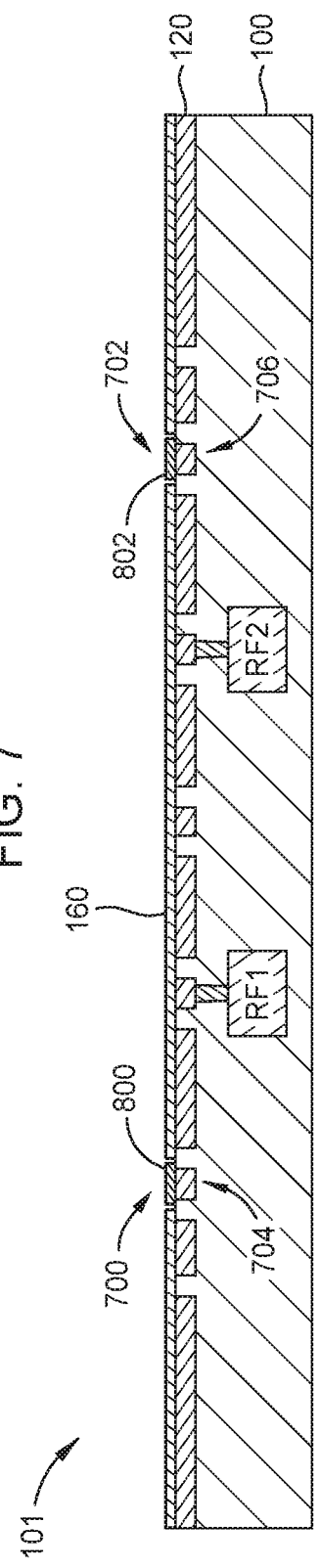
FIG. 8 is a cross-sectional view of the MEMS device of FIG. 7 having base layers deposited on the etched sections of the dielectric layer in accordance with an example embodiment of the disclosure.

Referring to FIG. 8, a layer is deposited over the bottom dielectric layer 160, the first layer 120, and the oxide layer 130 to form a first base layer 800 in the first opening 700 and a second base layer 802 in the second opening 702. The layer deposited to form the first and second base layers 800, 802 is then patterned with a photolithographic process and subsequently etched to remove all portions of the layer except the first base layer 800 and the second base layer 802. The deposition of the layer forming the first and second base layers 800, 802 may be through, for example, vapor deposition. The first and second base layers 800, 802 are formed to cover most of the first and second portions 704, 706 of the first layer 120 while being spaced from the adjacent bottom dielectric layer 160. The first and second base layers 800, 802 may be formed to have a thickness substantially the same or greater than the bottom dielectric layer 160. The first and second base layers 800, 802 will become the base upon which triple stacks of materials will be deposited, as described in FIG. 10, is later described.

Figure 9:
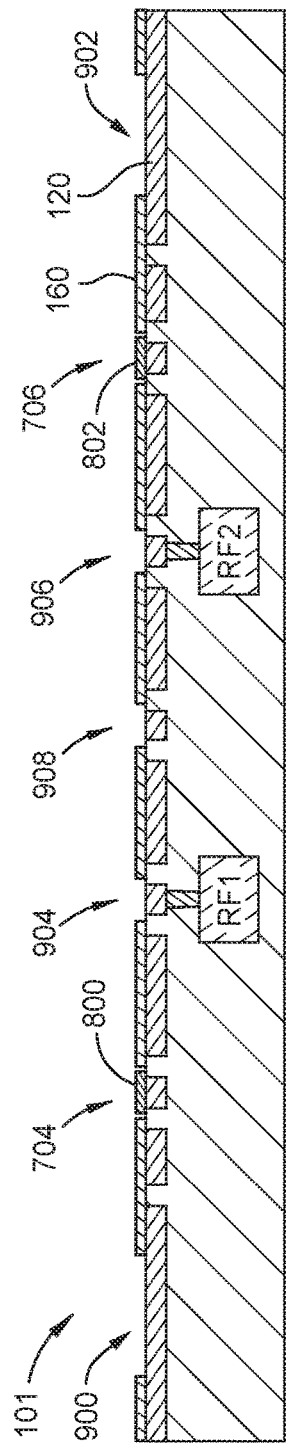
FIG. 9 is a cross-sectional view of the MEMS device of FIG. 8 with additional etched sections of the dielectric layer deposited in FIG. 6 in accordance with an example embodiment of the disclosure.

Referring to FIG. 9, an additional etching of the bottom dielectric layer 160 is performed to expose a third portion 900, a fourth portion 902, a fifth portion 904, a sixth portion 906, and a seventh portion 908 of the first layer 120. In this embodiment, a timed etch may be performed to produce etching in areas disposed above the RF1 conductor 106 (i.e., the fifth portion 904), the RF2 conductor 108 (i.e., the sixth portion 906), a centralized zone (i.e., the seventh portion 908), a left end area (i.e., the third portion 900), and a right end area (i.e., the fourth portion 902). The third portion 900 and the fourth portion 902 exposed may have a greater size than each of the fifth portion 904, the sixth portion 906, and the seventh portion 908. The seventh portion 908 exposed may have a greater size than each of the fifth portion 904 and the sixth portion 906.

Figure 10:
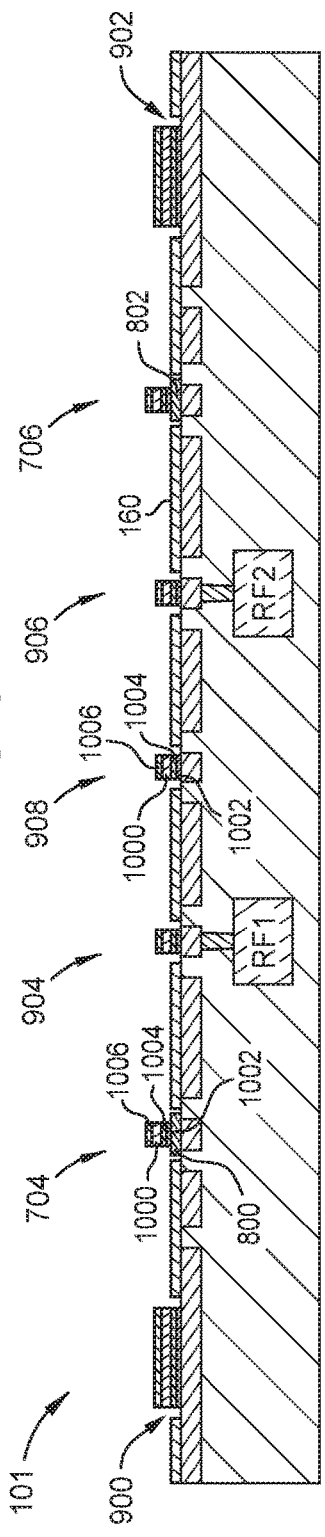
FIG. 10 is a cross-sectional view of the MEMS device of FIG. 9 with triple stacks deposit on the additional etched sections and on the base layers in accordance with an example embodiment of the disclosure.

Referring to FIG. 10, a triple stack of materials is deposited on each of the exposed portions 900-908 and on the first and second base layers 800, 802 (i.e., the first and second portions 704, 706). A bottom ruthenium (Ru) layer 1002 is first deposited, followed by a titanium nitride (TiN) layer 1004, and a top Ru layer 1000 deposited on the TiN layer 1004. A silicon dioxide hardmask 1006 is used to ensure that patterning of the triple stacks of materials may be performed as desired. Each layer 1002, 1000, 1004 is deposited over the top surface of the dielectric layer 160, first layer 120, exposed portions 900-908, and base layers 800, 802, and then patterned through a lithographic process and subsequently etched to form the triple stacks of materials. The bottom Ru layer 1002 may be etch stopped on the underlying first layer 120 or underlying base layer 800, 802, with high selectivity. The TiN layer 1004 may etch stopped on the underlying bottom Ru layer 1002 with high selectivity. The top Ru layer 1000 may be etch stopped on the underlying TiN layer 1004 with high selectivity.

Because triple stacks of materials are deposited on the first and second base layers 800, 802, the triple stacks of materials disposed in the first portion 704 and the second portion 706 have a greater height than the triple stacks of materials disposed in the third through seventh portions 900-908. The contacts disposed in the first and second portions 704, 706 are further disposed adjacent to the first and second RF conductors 106, 108 (i.e., are unaligned with the first and second RF conductors 106, 108).

Figure 11:
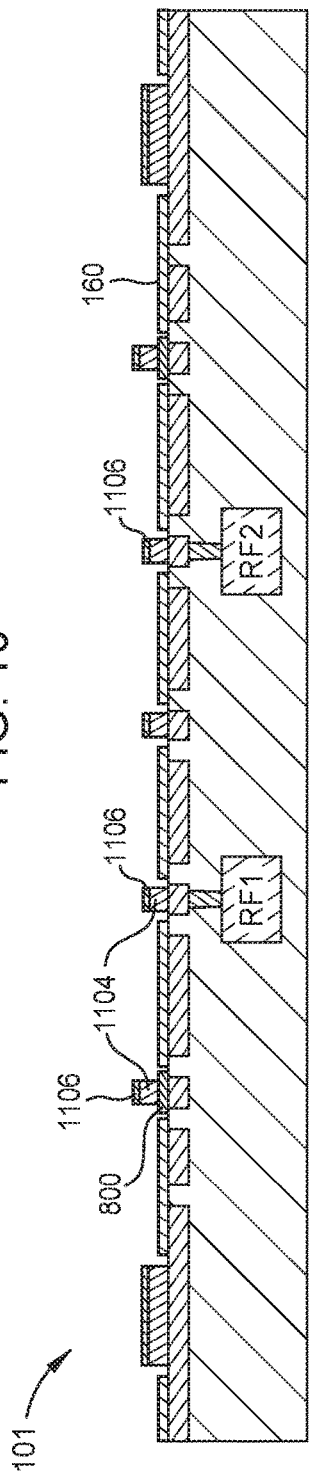
FIG. 11 is a cross-sectional view of the MEMS device of FIG. 9 with a single layer stack, as an alternative to FIG. 10, deposited on the etched sections and on the base layers in accordance with an example embodiment of the disclosure.

Referring to FIG. 11, a cross-sectional view of the arrangement 101 of FIG. 9 is illustrated. FIG. 11 is an alternative configuration to that disclosed in FIG. 10. In this alternative embodiment, a single contact layer of material is deposited. A titanium aluminum nitride hardmask 1106 is provided above and is used for patterning. Underneath the titanium aluminum nitride hardmask 1106 is a contact layer of ruthenium 1104. The contact layer of ruthenium 1104 may be etch stopped on an underlying first layer 120 or underlying base layer 800, 802 with high selectivity. The layer of ruthenium 1104 is deposited over the exposed surface of the arrangement 101, patterned through a lithographic process, and etched to form the single stack, similar to the stacks described in FIG. 10. In this embodiment, the titanium aluminum nitride hardmask 1106 can be stripped off during a photoresist removal step. While the following Figures build off of the arrangement 101 of FIG. 10, FIG. 11 may be used throughout instead continuing with FIG. 13.

Figure 12:
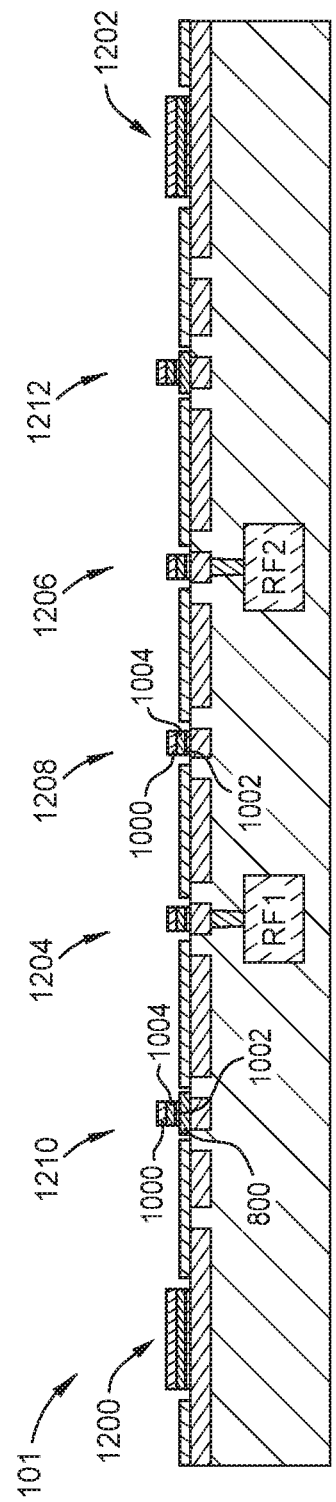
FIG. 12 is a cross-sectional view of the MEMS device of FIG. 10 having removed a hardmask layer from the stacks in accordance with an example embodiment of the disclosure.

Referring to FIG. 12, a cross-sectional view of the arrangement 101 of FIG. 10 is illustrated having the hardmask layer 1006 removed from each of the seven triple stack of materials (hereinafter referred to as RF1 stack 1204, RF2 stack 1206, center stack 1208, PB1 stack 1210, PB2 stack 1212, left end stack 1200, and right end stack 1202). A photoresist (not shown) may be patterned to expose the seven triple stacks of materials and then removed. The RF1 stack 1204 is disposed above the RF1 conductor 106 such that the RF1 stack 1204 is aligned with the RF1 conductor 106 and electrically connected to it through via 102. Similarly, the RF2 stack 1206 is disposed above the RF2 conductor 108 such that the RF2 stack 1206 is aligned with the RF2 conductor 108 and electrically connected to it through via 104. The center stack 1208 is disposed between the RF1 stack 1204 and the RF2 stack 1206. The PB1 stack 1210 is disposed adjacent to the RF1 stack 1204, and the PB2 stack 1212 is disposed adjacent to the RF2 stack 1206. The left end stack 1200 is disposed adjacent to the PB1 stack 1210, and the right end stack 1202 is disposed adjacent to the PB2 stack 1212.

The PB1 stack 1210 is comprised of the first base layer 800, bottom Ru layer 1002, TiN layer 1004, and top Ru layer 1000, and the PB2 stack 1212 is comprised of the second base layer 802, bottom Ru layer 1002, TiN layer 1004, and top Ru layer 1000. Each of RF1 stack 1204, RF2 stack 1206, center stack 1208, left end stack 1200, and right end stack 1202 are individually comprised of the bottom Ru layer 1002, TiN layer 1004, and top Ru layer 1000. As such, PB1 stack 1210 and PB2 stack 1212 have a greater height than each of RF1 stack 1204, RF2 stack 1206, center stack 1208, left end stack 1200, and right end stack 1202. Additionally, the left end stack 1200 and the right end stack 1202 may have a greater width than each of the RF1 stack 1204, RF2 stack 1206, center stack 1208, PB1 stack 1210, and PB2 stack 1212. The center stack 1208 may have a greater width than each of the RF1 stack 1204, RF2 stack 1206, PB1 stack 1210, and PB2 stack 1212.

Each of RF1 stack 1204, RF2 stack 1206, center stack 1208, PB1 stack 1210, and PB2 stack 1212 is individually configured to contact the bottom of a beam, described later. In one example embodiment, during deflection of the beam, PB1 stack 1210 and PB2 stack 1212 are simultaneously contacted by the beam, followed by the center stack 1208, and then followed by the RF1 stack 1204 and the RF2 stack 1206 contacting simultaneously. In another example embodiment, during deflection of the beam, the center stack 1208 is first contacted by the beam, followed by PB1 stack 1210 and PB2 stack 1212 contacting simultaneously, and then followed by the RF1 stack 1204 and the RF2 stack 1206 contacting simultaneously. In either embodiment, the RF1 stack 1204 and the RF2 stack 1206 contact the beam last. As such, the impact of the actuating beam occurs on the center stack 1208 and/or the PB1 and PB2 stacks 12010, 1212. In embodiments, the contact of the PB1 stack 1210, PB2 stack 1212, and center stack 1208 may cause the beam contact area to perform as a hinge area. Each of RF1 stack 1204, RF2 stack 1206, center stack 1208, PB1 stack 1210, PB2 stack 1212, left end stack 1200, and right end stack 1202 may act as supports for the beam when the beam is deflected downwards towards the stacks.

Figure 13:
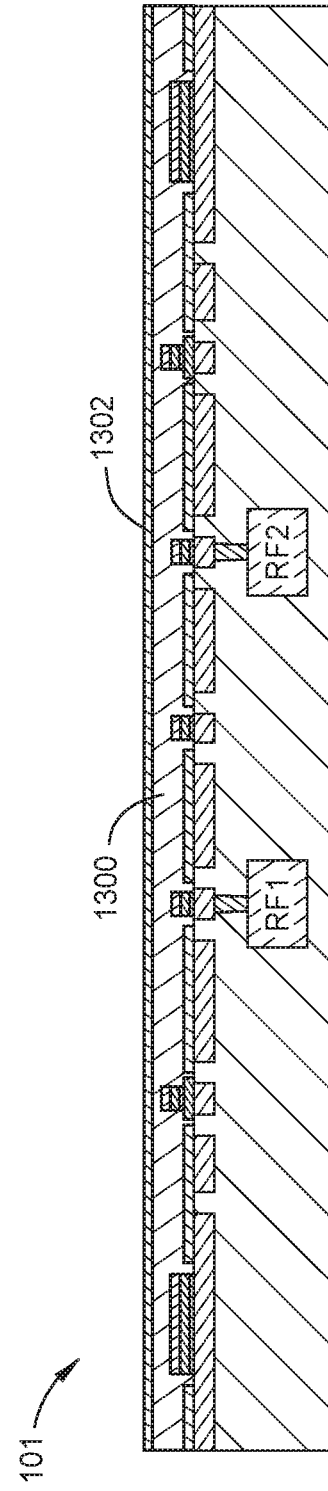
FIG. 13 is a cross-sectional view of the MEMS device of FIG. 12 having a spun layer and first dielectric layer deposited thereon in accordance with an example embodiment of the disclosure.

Referring to FIG. 13, a first spun layer 1300 and a first dielectric layer 1302 are deposited over the entire top of the arrangement 101 of FIG. 12. The first spun layer 1300 may be spun and the first dielectric layer 1302 may be deposited with known means. The first spun layer 1300 may be a sacrificial layer. The first dielectric layer 1302 may be comprised of silicon dioxide.

Figure 14:
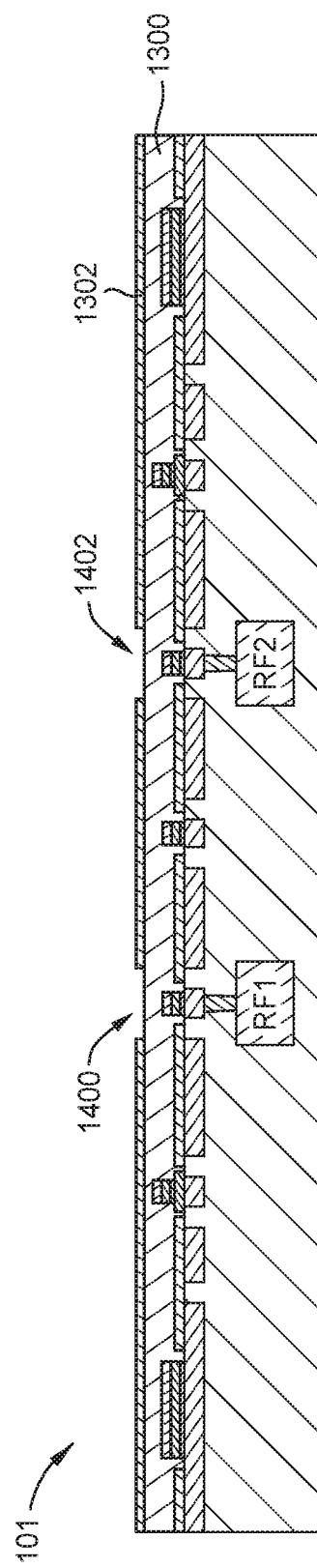
FIG. 14 is a cross-sectional view of the MEMS device of FIG. 13 having etched areas of the first dielectric layer in accordance with an example embodiment of the disclosure.

Referring to FIG. 14, areas 1400, 1402 of the first deposited layer 1302 disposed above and aligned with the RF1 stack 1204 and the RF2 stack 1206 are removed from the arrangement 101 of FIG. 13. The removed areas 1400, 1402 may have a greater width than the RF1 stack 1204 and the RF2 stack 1206 disposed below. The removed areas 1400, 1402 are provided for a beam contact layer, as described in FIG. 15. The removed areas 1400, 1402 may be removed by etching.

Figure 15:
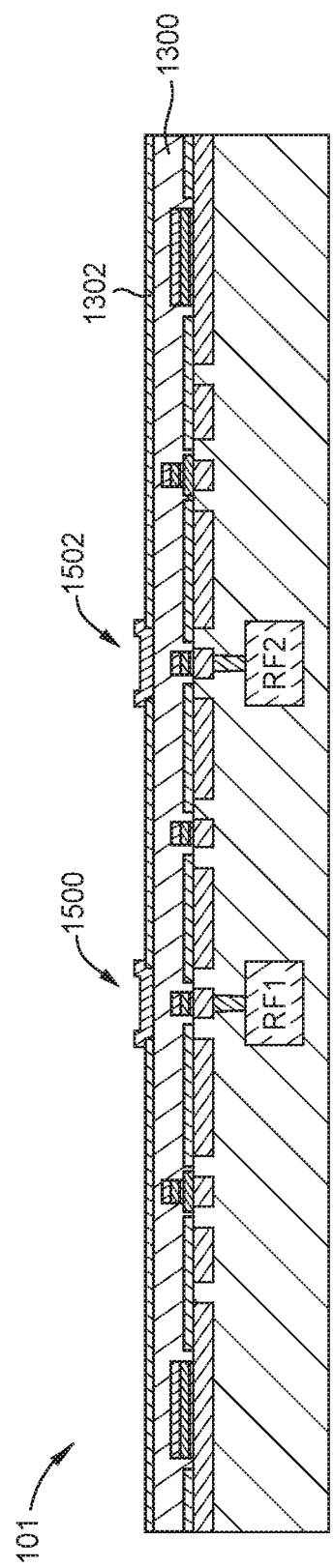
FIG. 15 is a cross-sectional view of the MEMS device of FIG. 14 having a deposited beam contact layer deposited in the etched areas of the first dielectric layer in accordance with an example embodiment of the disclosure.

Referring to FIG. 15, beam contact layers 1500, 1502 are deposited in the removed areas 1400, 1402 of FIG. 14 and patterned. The beam contact layers 1500, 1502 are disposed above and aligned with the RF1 stack 1204 and the RF2 stack 1206. The beam contact layers 1500, 1502 may comprise ruthenium. The beam contact layers 1500, 1502 may have a greater width than the removed areas 1400, 1402 so that the beam contact layers 1500, 1502 may be etch stopped on the underlying first deposited layer 1302 with high selectivity. The beam contact layers 1500, 1502 are configured to accept or contact a bottom beam layer, described in relation to FIG. 17. The beam contact layers 1500, 1502 are further configured to facilitate ohmic contact to the underlying RF1 stack 1204 and RF2 stack 1206 through the contact of the bottom beam layer.

Figure 16:
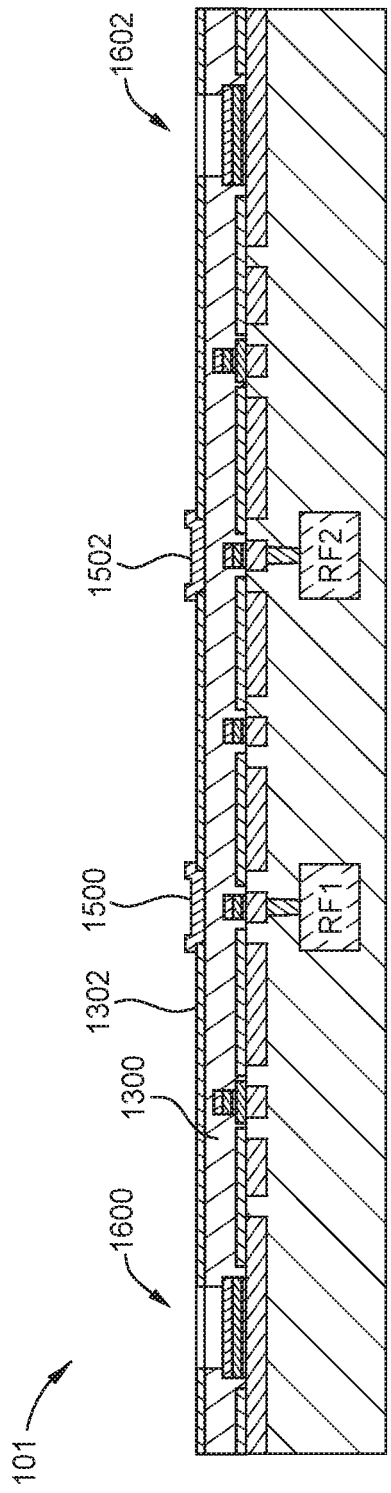
FIG. 16 is a cross-sectional view of the MEMS device of FIG. 15 with portions of the first spun layer patterned in accordance with an example embodiment of the disclosure.

Referring to FIG. 16, a cross-sectional view of the arrangement 101 of FIG. 15 is disclosed having vias for forming anchor sections 1600, 1602. The anchor sections 1600, 1602 are formed by etching the first spun layer 1300 and the first dielectric layer 1302 disposed above the left end stack 1200 and right end stack 1202 to create vias. The vias are later filled (FIG. 17) to create the anchor sections 1600, 1602. The anchor sections 1600, 1602 are in contact with the top Ru layer 1000 of both the left end stack 1200 and the right end stack 1202. The anchor sections 1600, 1602 will be used to anchor future created portions, such as a beam.

Figure 17:
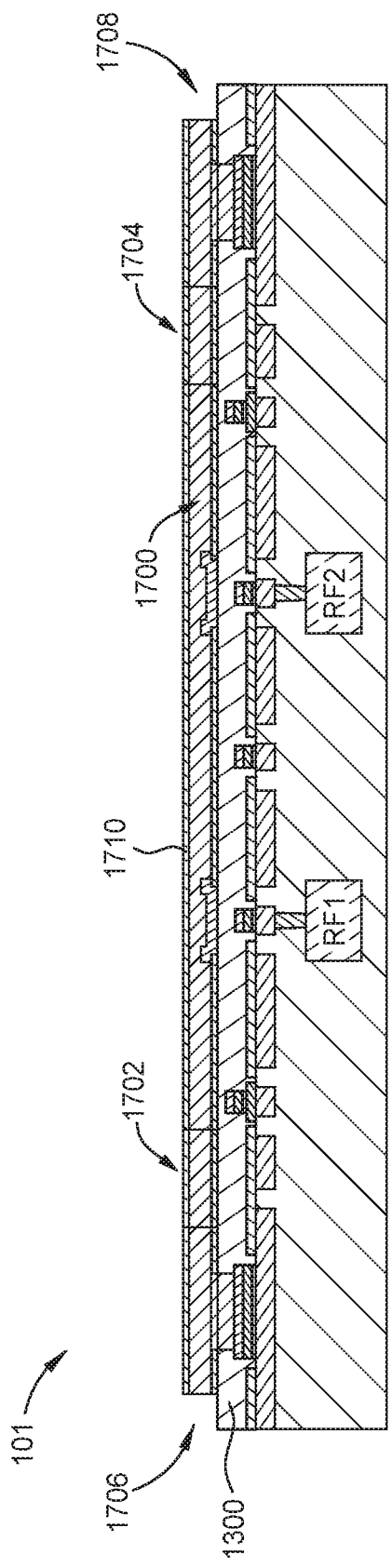
FIG. 17 is a cross-sectional view of the MEMS device of FIG. 16 having a bottom beam layer deposited thereon in accordance with an example embodiment of the disclosure.

Referring to FIG. 17, a bottom beam layer 1700 and a first additional beam layer 1710 are deposited on the arrangement 101 of FIG. 16, including within the vias created in FIG. 16 and on the sidewalls of the vias to form anchors in the patterned anchor sections 1600, 1602. The first additional beam layer 1710 may comprise a dielectric material. The bottom beam layer 1700 and the first additional beam layer 1710 are then etched to comprise etched areas 1706, 1708 disposed at both ends of the arrangement 101, reducing the overall length of both the bottom beam layer 1700 and the first additional beam layer 1710. The etched areas 1706, 1708 do not extend to either anchor section 1600, 1602 (i.e., the etched areas 1706, 1708 do not overlap with the anchor sections 1600, 1602). Two leg areas 1702, 1704 are formed to be supportive sections for later formations. The first leg area 1702 of the bottom beam layer 1700 may be disposed between the left end stack 1200 and the PB1 stack 1210 while the second leg area 1704 of the bottom beam layer 1700 may be disposed between the right end stack 1202 and the PB2 stack 1212.

The bottom beam layer 1700 and the first additional beam layer 1710 are configured to act as one layer, hereinafter collectively referred to as the bottom beam layer 1700. The bottom beam layer 1700 is configured to deflect from a resting position to a first downward position and a second upward position. In embodiments, the deflection of the bottom beam layer 1700 is controlled such that the PB1 stack 1210 and PB2 stack 1212 contact the bottom beam layer 1700 prior to the at least the two RF contact points (i.e., RF1 stack 1204 and RF2 stack 1206).

Figure 18:
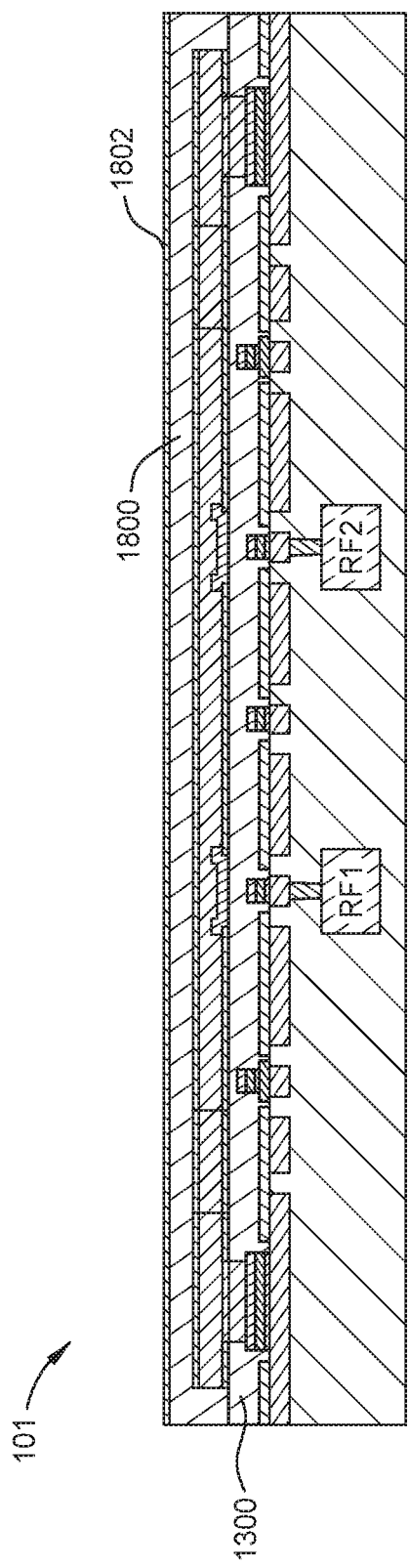
FIG. 18 is a cross-sectional view of the MEMS device of FIG. 17 having a second spun layer and a second dielectric layer deposited thereon in accordance with an example embodiment of the disclosure.

Referring to FIG. 18, a cross-sectional view of the arrangement 101 of FIG. 17 is illustrated having a second spun layer 1800 and a second dielectric layer 1802 deposited thereon. The second spun layer 1800 may be a sacrificial layer. The second dielectric layer 1802 may be a silicon dioxide layer. The second spun layer 1800 may comprise the same material as the first spun layer 1300, and the second dielectric layer 1802 may comprise the same material as the first dielectric layer 1302. The second spun layer 1800 is deposited in the patterned areas 1706, 1708 disposed at the ends of the bottom beam layer 1700 such that the second spun layer 1800 contacts a portion of the first spun layer 1300.

Figure 19:
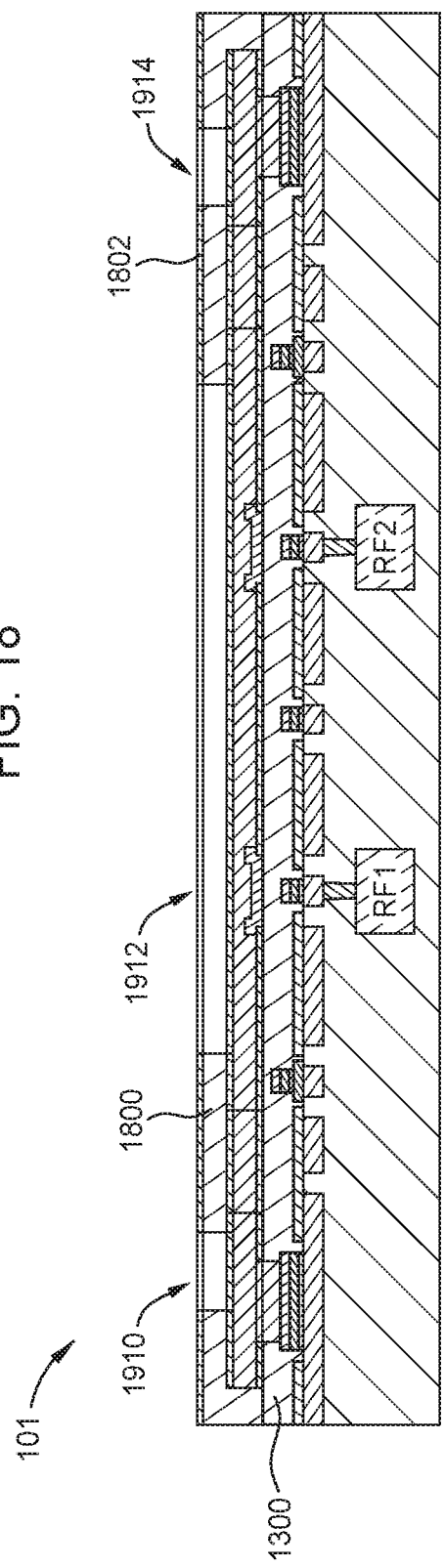
FIG. 19 is a cross-sectional view of the MEMS device of FIG. 18 with the second spun layer being patterned to create a plurality of links formed between a bottom beam and a top beam layer in accordance with an example embodiment of the disclosure.
Figure 20:
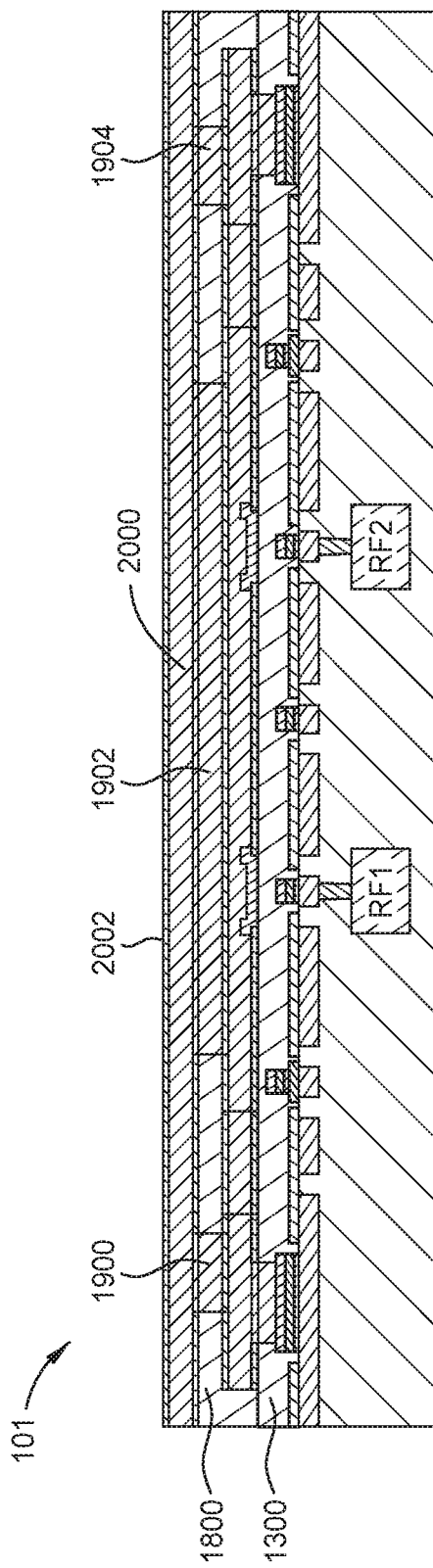
FIG. 20 is a cross-sectional view of the MEMS device of FIG. 19 having a top beam layer deposited thereon in accordance with an example embodiment of the disclosure.

Referring to FIG. 19, portions of the second spun layer 1800 and the second dielectric layer 1802 of the arrangement 101 of FIG. 18 are etched to form a plurality of vias 1910, 1912, 1914 that will form a plurality of links 1900, 1902, 1904 between a bottom beam (i.e., bottom beam layer 1700) and a top beam layer (shown in FIG. 20).

Referring to FIG. 20, a cross-sectional view of the arrangement 101 of FIG. 19 is illustrated having a deposited top beam layer 2000. A second additional beam layer 2002 may be deposited on the top beam layer 2000. The second additional beam layer 2002 may comprise a dielectric material. The top beam layer 2000 and the second additional beam layer 2002 are configured to act as one layer, hereinafter collected referred to as the top beam layer 2000. The top beam layer 2000 and the second additional beam layer 2002 are also deposited within each of the etched vias 1910, 1912, 1914 in the second spun layer 1800 and on the sidewalls of these etched vias 1910, 1912, 1914, thereby creating the plurality of links 1900, 1902, 1904 between the bottom beam layer 1700 and top beam layer 2000. The top beam layer 2000 acts as the top layer of a beam traversing cavities created in later steps.

Figure 21:
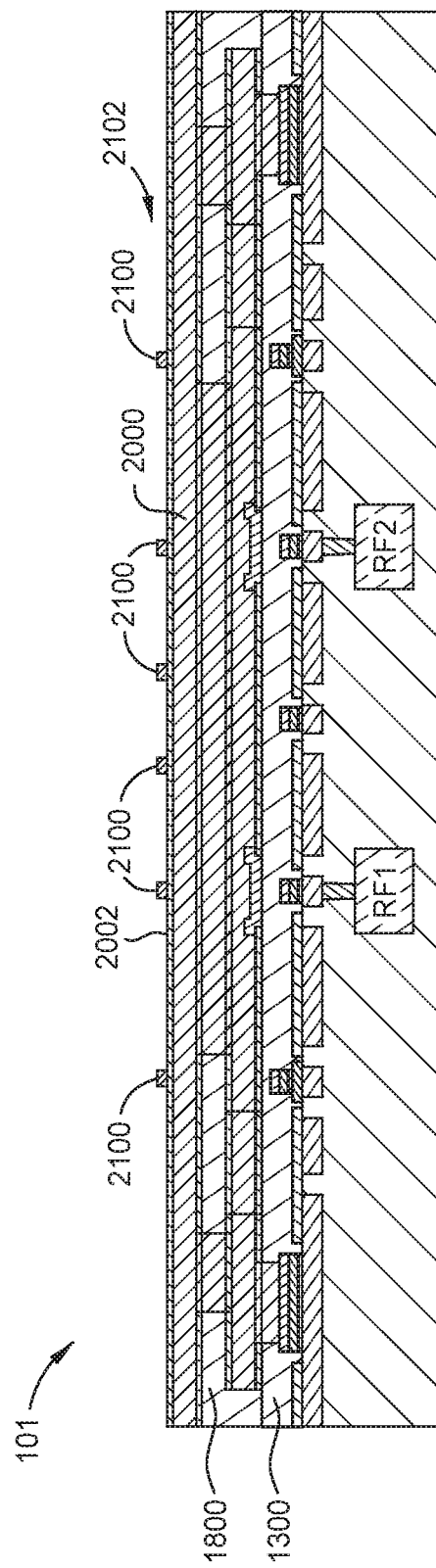
FIG. 21 is a cross-sectional view of the MEMS device of FIG. 20 a plurality of bumps deposited thereon in accordance with an example embodiment of the disclosure.

Referring to FIG. 21, a cross-sectional view of the arrangement 101 of FIG. 20 is illustrated having a plurality of bumps 2100 disposed above the top beam layer 2000. The plurality of bumps 2100 may be deposited as a one layer through chemical vapor deposition, as a non-limiting embodiment, which is then patterned to form the plurality of bumps 2100. The plurality of bumps 2100 may be used to contact a layer disposed above the top beam layer 2000 to prevent the top beam layer 2000 from directly contacting or colliding with the layer disposed above the top beam layer 2000.

Each of the bumps 2100 may have a height extending above the top beam layer 2000 of about 500 angstroms to about 700 angstroms, such as about 600 angstroms, and a width of about 0.5 µm to about 1 µm. Each of the bumps 2100 may have the same height and/or width, or each of the bumps 2100 may have varying heights and/or widths. Additionally, each of the bumps 2100 may be spaced from an adjacent bump 2100 by a distance between about 4 microns to about 6 microns, and the spacing between each bump 2100 may vary. For example, six bumps 2100 are shown in FIG. 21.

While one row 2102 of bumps 2100 is shown, one or more additional rows of bumps 2100 (shown in FIGS. 31-33) may be disposed on the top beam layer 2000 adjacent to the front row 2102 of bumps 2100 shown in FIG. 21, either aligned or misaligned with the front row 2102 of bumps 2100. In such an embodiment, each row of bumps 2100 may be spaced from an adjacent row of bumps 2100 by a distance of about 3 microns. Moreover, while six bumps 2100 are shown in FIG. 21, any number of bumps 2100 may be disposed on the top beam layer 2000 and/or within each row, and the number of bumps 2100 is not intended to be limiting.

Referring to FIG. 22, the top beam layer 2000 is etched at the ends 2204, 2206 of the arrangement 101 to remove a portion of the top beam layer 2000 from each end 2004, 2006. The top beam layer 2000 may be etched to have a shorter length than the bottom beam layer 1700 (i.e., a greater amount of material of the top beam layer 2000 may be removed than is removed from the bottom beam layer 1700). A third leg 2200 and a fourth leg 2202 are then formed in the top beam layer 2000. The third leg 2200 and the fourth leg 2202 may be disposed above or aligned with the first leg 1702 and the second leg 1704.

Referring to FIG. 23, a third spun layer 2300 and third dielectric layer 2302 are deposited over the plurality of bumps 2100 and the top beam layer 2000 of the arrangement 101 of FIG. 22. The third spun layer 2300 may be a sacrificial layer. The third dielectric layer 2302 may be a silicon dioxide layer. The third spun layer 2300 may comprise the same materials as the first spun layer 1300 and/or the second spun layer 1800, and the third dielectric layer 2302 may comprise the same material as the first dielectric layer 1302 and/or the second dielectric layer 1802. The third dielectric layer 2302 may have a greater thickness than the first dielectric layer 1302 and/or the second dielectric layer 1802. The third spun layer 2300 is deposited over each end 2004, 2006 such that portions of the third spun layer 2300 contact portions of the second spun layer 1800.

Figure 28:
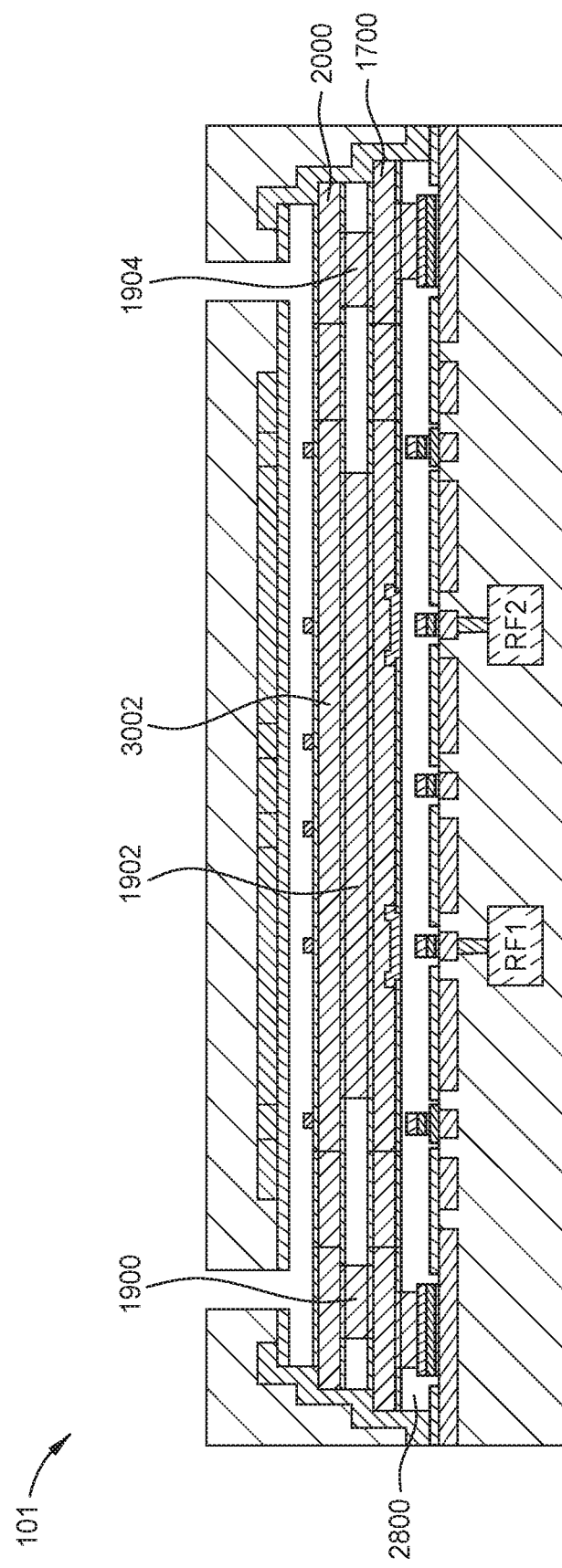
FIG. 28 is a cross-sectional view of the MEMS device of FIG. 27 with a removal of specific layers to produce cavities for the MEMS device in accordance with an example embodiment of the disclosure.

The third spun layer 2300 may have a first thickness extending between the top beam layer 2000 and the third dielectric layer 2302 of about 250 nm to about 350 nm, and a second thickness extending from the top of the bumps 2100 to the third dielectric layer 2302 of about 200 nm to about 300 nm (i.e., the second thickness is equal to the first thickness minus the thickness of the bumps 2100). The thickness of the third spun layer 2300 is selected to control the spacing between the top beam layer 2000 and the third dielectric layer 2302, as the third spun layer 2300 is later removed to form a cavity or gap between the bumps 2100 disposed on the top beam layer 2000 and the third dielectric layer 2302, as shown in FIG. 28. In one embodiment, the third spun layer 2300 has a smaller thickness than the first spun layer 1300 and/or the second spun layer 1800.

Referring to FIG. 24, a cross-sectional view of the arrangement 101 of FIG. 23 is illustrated having etched portions 2400, 2402 disposed at both ends 2204, 2206 of the arrangement 101. The etched portions 2400, 2402 are formed to create a cavity for the arrangement 101. The etched portions 2400, 2402 are formed by etching a portion of the first spun layer 1300, the second spun layer 1800, and the third spun layer 2300. The first spun layer 1300 may be etched to be aligned or flush with the bottom beam layer 1700. The second spun layer 1800 may be etched to be aligned or flush with the top beam layer 2000. The third spun layer 2300 may be etched to have a length less than the top beam layer 2000.

Referring to FIG. 25, a partial cavity layer 2500 is deposited on the arrangement 101 of FIG. 24 and areas 2502, 2504 of the partial cavity layer 2500 are removed by etching. The partial cavity layer 2500 is deposited over the etched portions 2400, 2402 and on the third dielectric layer 2302. Thus, the partial cavity layer 2500 contacts at least the first spun layer 1300, the first dielectric layer 1302, the bottom beam layer 1700, the second spun layer 1800, the second dielectric layer 1802, the top beam layer 2000, the third spun layer 2300, and the third dielectric layer 2302. The areas 2502, 2504 of the partial cavity layer 2500 are then etched such that portions of the third dielectric layer 2302 disposed above the left end stack 1200 and the right end stack 1202 are exposed. The partial cavity layer 2500 disposed above the top beam layer 2000 forms a top electrode and is used to pull the formed MEMS beam, completed as described later, to an upward position.

Figure 26:
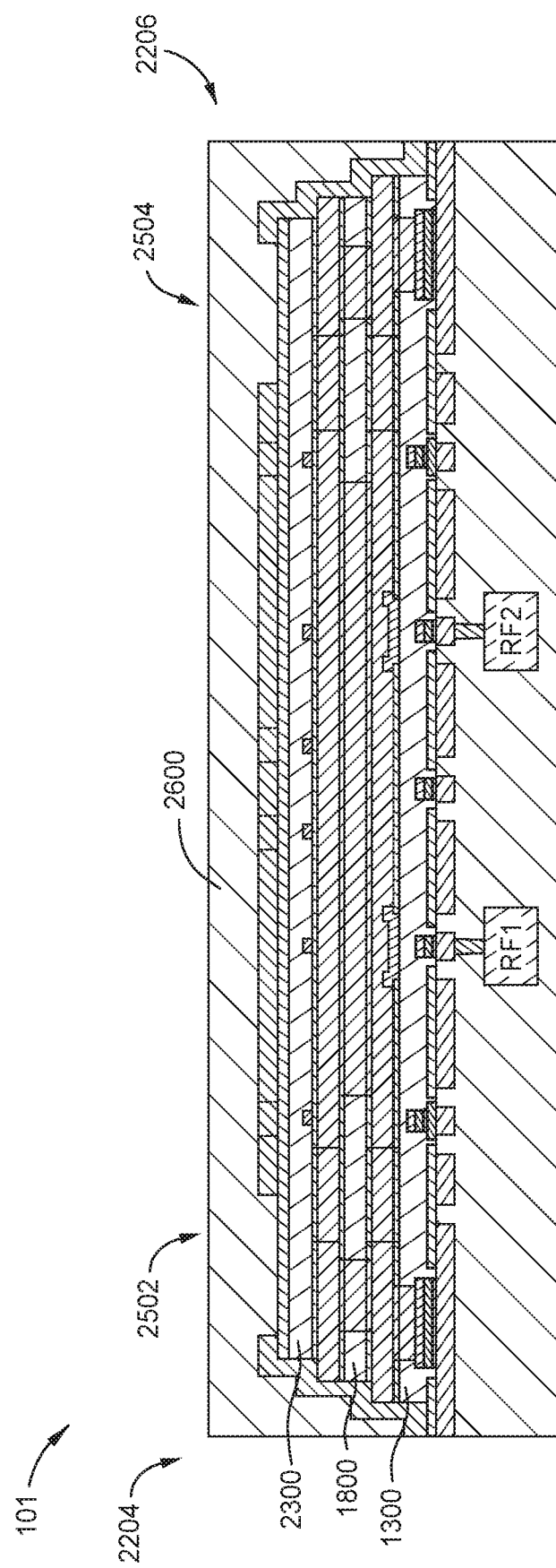
FIG. 26 is a cross-sectional view of the MEMS device of FIG. 25 having a roof dielectric layer deposited thereon in accordance with an example embodiment of the disclosure.

Referring to FIG. 26, a roof dielectric layer 2600 is deposited on the arrangement 101 of FIG. 25. The roof dielectric layer 2600 contacts the partial cavity layer 2500 and portions of the third dielectric layer 2302 exposed through the etched areas 2502, 2504. The roof dielectric layer 2600 is deposited above the partial cavity layer 2500 and on each of the ends 2204, 2206.

Figure 27:
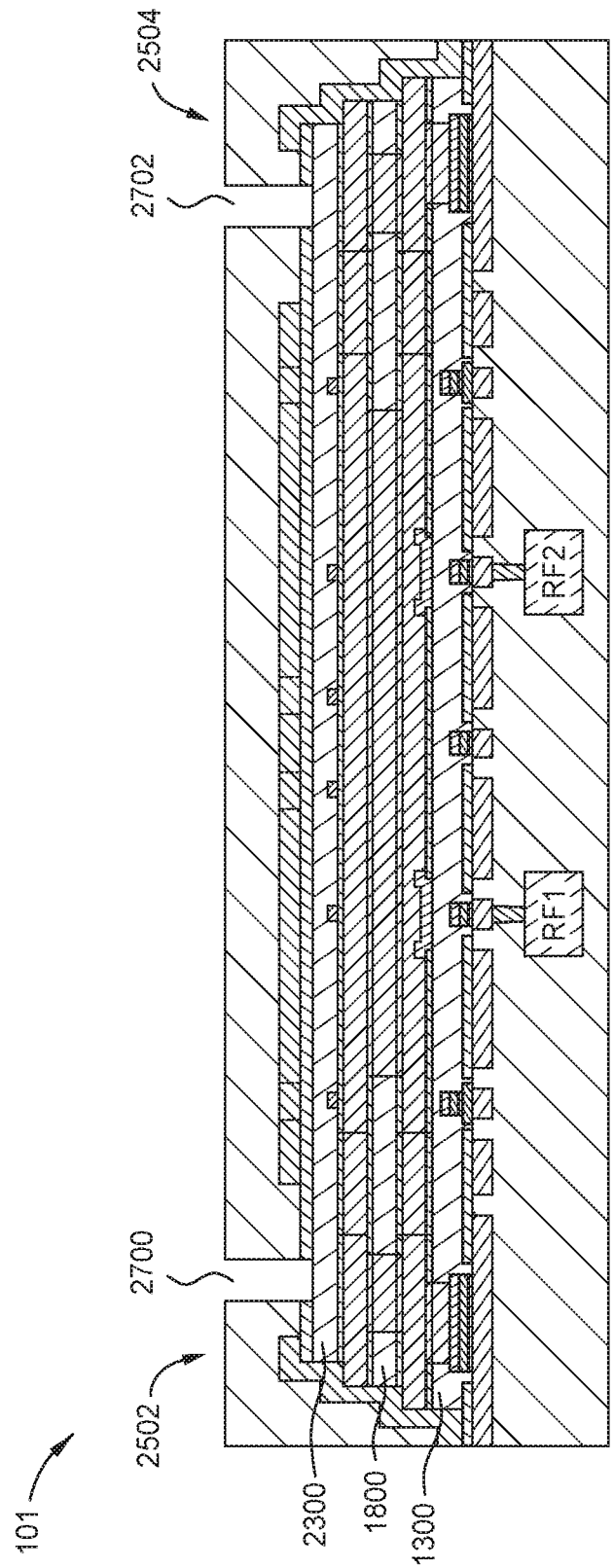
FIG. 27 is a cross-sectional view of the MEMS device of FIG. 26 having release holes etched through the roof dielectric in accordance with an example embodiment of the disclosure.

Referring to FIG. 27, a first release hole 2700 and a second release hole 2702 are etched through portions of the roof dielectric layer 2600 and the third dielectric layer 2302. The release holes 2700, 2702 are disposed above the etched areas 2502, 2504 of the partial cavity layer 2500. The release holes 2700, 2702 are etched through the roof dielectric layer 2600 and a portion of the third dielectric layer 2302 such that the release holes 2700, 2702 extend through to the third spun layer 2300. The release holes 2700, 2702 may be partially disposed above the left end stack 1200 and the right end stack 1202. In a non-limiting embodiment, the etching may be a timed etch.

Referring to FIG. 28, the first, second, and third spun layers 1300, 1800, 2300 are removed to produce a cavity 2800 for the arrangement 101. The resulting arrangement 101 provides a beam 3002 comprised of at least the bottom beam layer 1700 and the top beam layer 2000 within the arrangement 101. The bottom beam layer 1700 is coupled to the top beam layer 2000 through the plurality of links 1900, 1902, 1904 created in FIG. 19.

Figure 29:
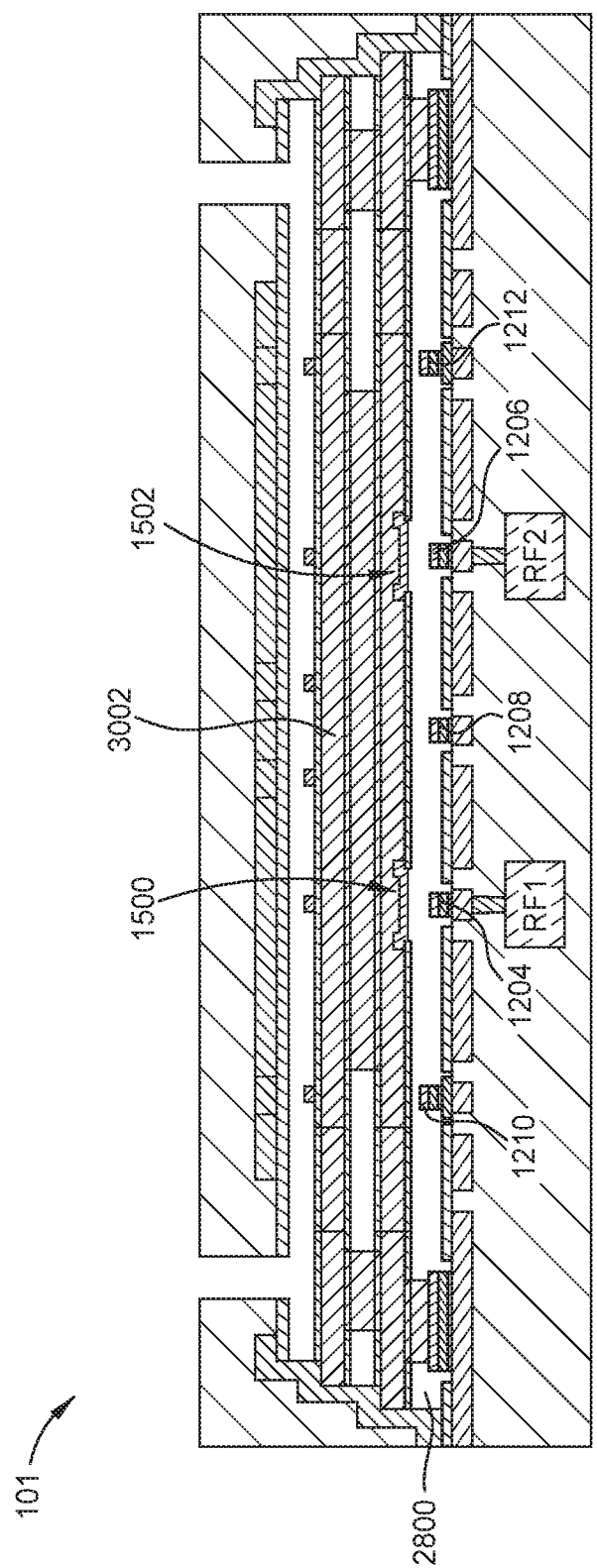
FIG. 29 is a cross-sectional view of the MEMS device of FIG. 28 having partially removal material from the stacks and beam layers in accordance with an example embodiment of the disclosure.

Referring to FIG. 29, a portion of the top Ru layer 1000 of the RF1 stack 1204, RF2 stack 1206, center stack 1208, PB1 stack 1210, and PB2 stack 1212 is partially removed. A bottom portion of the beam contact layers 1500, 1502 disposed above the cavity 2800 is partially removed as well. Etching a portion of the top Ru layer 1000 from each of the stacks 1204-1212 cleans the surface of each of the stacks 1204-1212 that was in contact with the first spun layer 1300. Etching a bottom portion of the beam contact layers 1500, 1502 recesses the beam contact layers 1500, 1502 into the bottom beam layer 1700. Recessing the beam contact layers 1500, 1502 into the bottom beam layer 1700 ensures that the center stack 1208 contacts the beam 3002 prior to either of the RF1 stack 1204 and RF2 stack 1206, as the RF1 stack 1204 and RF2 stack 1206 are now disposed a greater distance from the beam 3002 comprising the beam contact layers 1500, 1502 than the center stack 1208. The partial removal of the top Ru layer 1000 may be executed using a plasma etch of a solution containing chlorine. The solution may also include, as a non-limiting embodiment, fluorine.

Figure 30:
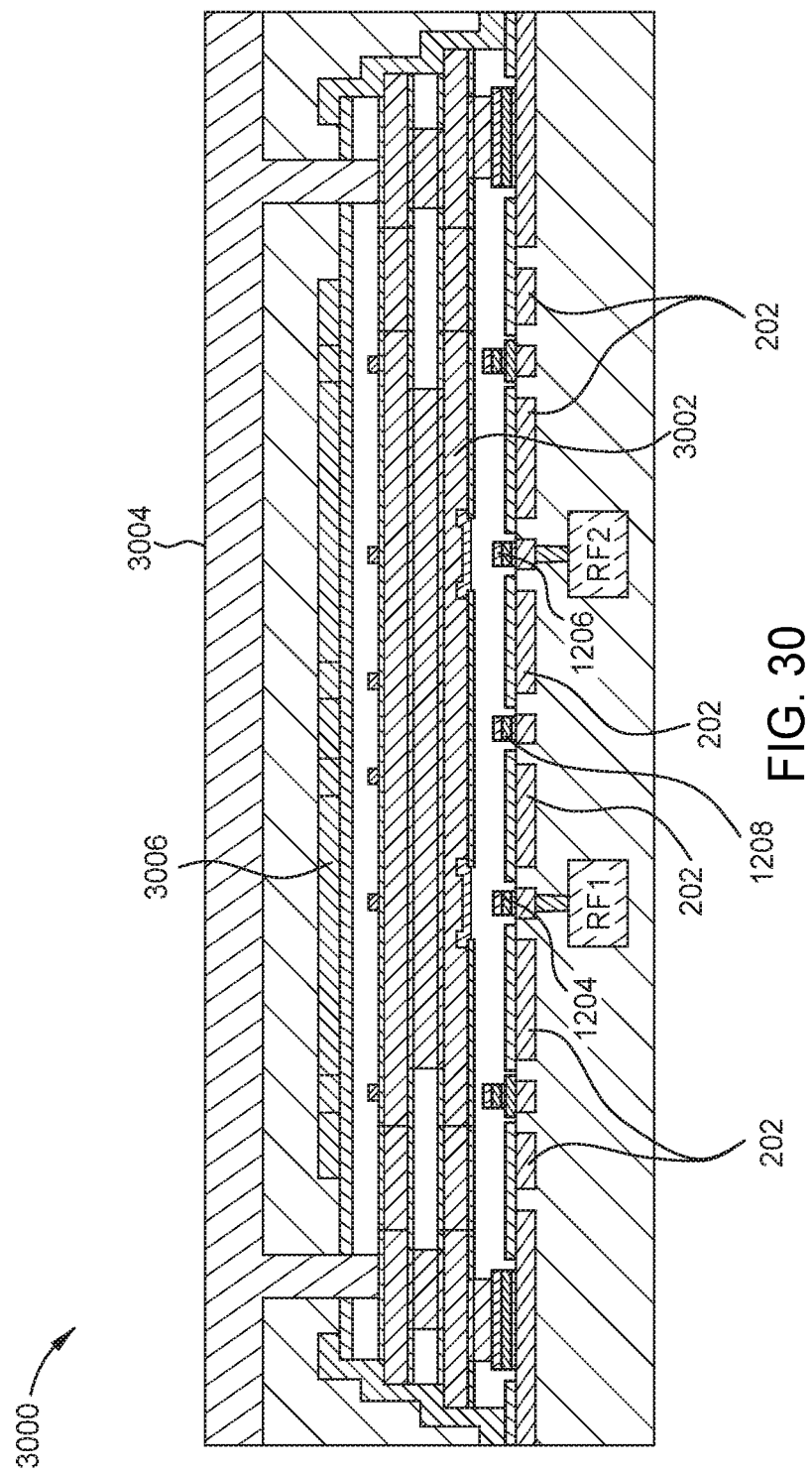
FIG. 30 is a cross-sectional view of the MEMS device of FIG. 29 having a seal layer deposited thereon, completing the overall MEMS device in accordance with an example embodiment of the disclosure.

Referring to FIG. 30, a top seal layer 3004 is deposited to enclose the completed MEMS switch 3000 within the cavity 2800. In the illustrated embodiment, the beam 3002, comprised of at least the bottom beam layer 1700 and the top beam layer 2000, may deflect in an upward direction or a downward direction. As described above, if the beam 3002 deflects in the downward direction, the beam 3002 will contact at least the center stack 1208 prior to contacting either of the RF1 stack 1204 and the RF2 stack 1206. The top electrode 3006 may be used to deflect the beam 3002 in an upwards direction, and the bottom electrodes 202 may be used to deflect the beam 3002 in the downwards direction. As such, the beam 3002 is movable between the top electrode 3006 and the RF1 and RF2 stacks 1204, 1206.

Figure 31:
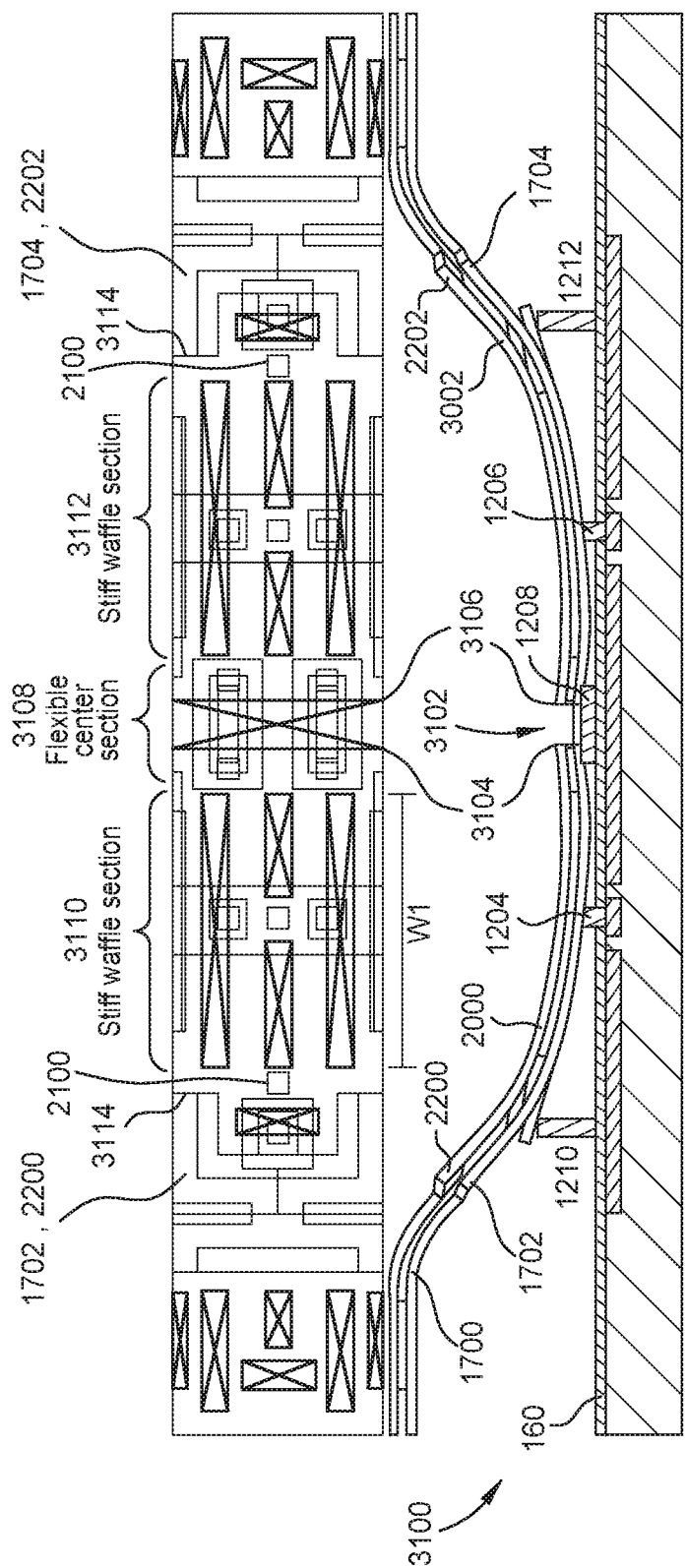
FIG. 31 is a cross-sectional view of a MEMS device having a hinged section and stiff waffle sections, according to one embodiment.

Referring to FIG. 31, a cross-sectional view and a top view of a MEMS switch 3100 is illustrated, according to one embodiment. The MEMS switch 3100 may be the same as the MEMS switch 3000 of FIG. 30; however, a portion of the second spun layer 1800 disposed above the center stack 1208 is removed in the MEMS switch 3100 to create a hinge section 3102. The MEMS switch 3100 comprises two stiff waffle sections 3110, 3112 separated by a flexible center section 3108. Each of the stiff waffle sections 3110, 3112 has a first width W1. The stiff waffle sections 3110, 3112 are comprised of the plurality of links 1902 formed in FIG. 19. Legs 1702, 1704, 2200, 2202 are attached to each stiff waffle section 3110, 3112 at location 3114 inboard of the PB1 stack 1210 and the PB2 stack 1212, which ensures that the beam 3002 contacts the PB1 stack 1210 and the PB2 stack 1212 before contacting the RF1 stack 1204 and the RF2 stack 1206.

Portions of the second spun layer 1800 may be removed through etching of the second spun layer 1800 in FIG. 19. Removing the portion (i.e., hinge section 3102) of the second spun layer 1800 disposed above the center stack 1208 before the top beam layer 2000 is deposited results in a hinge section 3102 that enables the sidewalls 3104, 3106 of the top beam layer 2000 and the flexible center section 3108 to act as a hinge for the rest of the beam 3002 during deflection. Additionally, utilizing a wide center stack 1208 provides additional mechanical support for the landed beam 3002 and prevents the beam 3002 from contacting the bottom dielectric layer 160 disposed on the surface of the substrate between the center stack 1208 and the RF stacks 1204, 1206, which in turn prevents or reduces charging and stiction issues.

Figure 32:
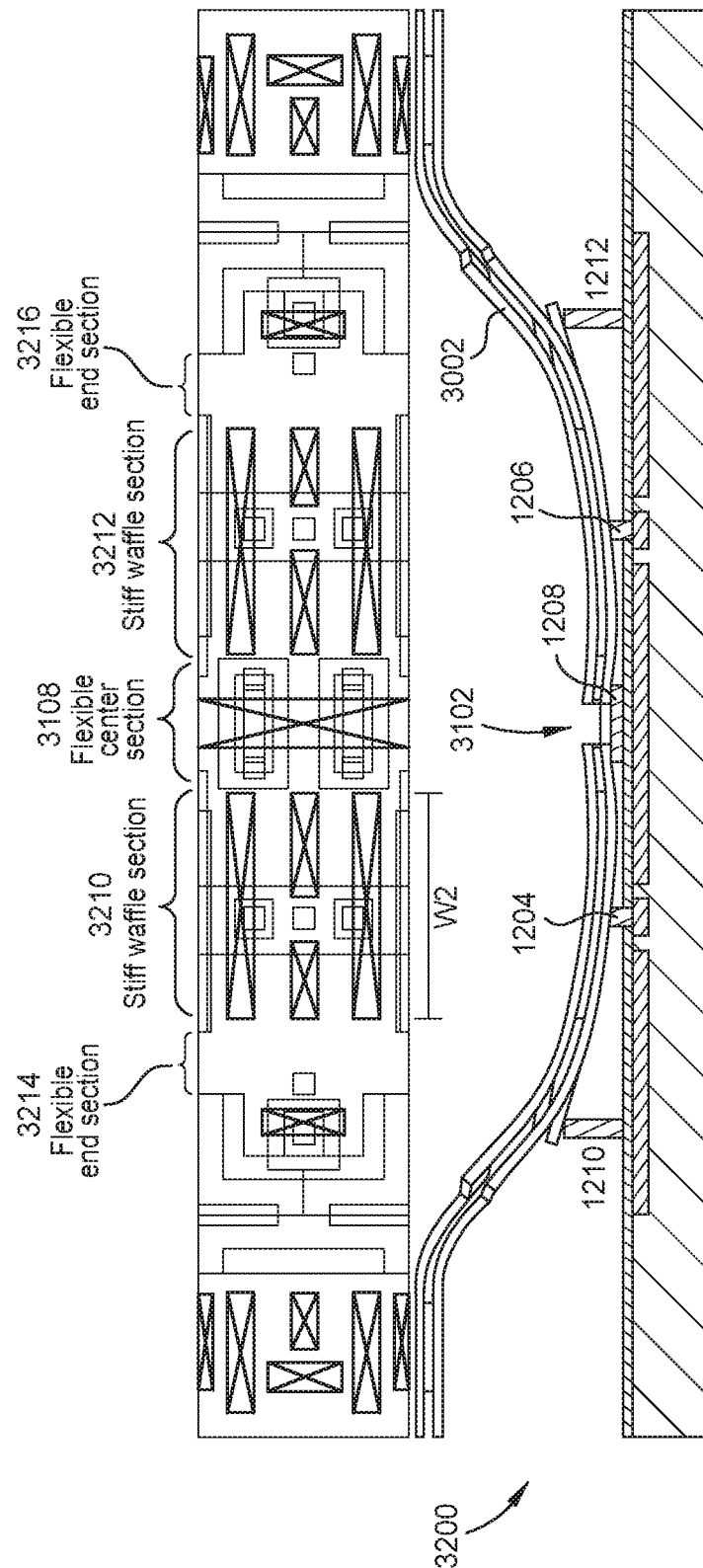
FIG. 32 is a cross-sectional view of a MEMS device having a hinged section and stiff waffle sections, according to another embodiment.

Referring to FIG. 32, another configuration of a MEMS switch 3200 is illustrated. The MEMS switch 3200 may be the same as the MEMS switch 3100; however, the stiff waffle sections 3210, 3212 of the MEMS switch 3200 have a second width W2 that is less than the first width W1 of the stiff waffle sections 3110, 3112 of the MEMS switch 3100. The stiff waffle sections 3210, 3212 have been pulled away from the PB1 stack 1210 and PB2 stack 1212, creating a more flexible waffle section 3214, 3216 between the PB1/PB2 stacks 1210, 1212 and the stiff waffle sections 3210, 3212. In the MEMS switch 3200, by reducing the width of the plurality of links 1902 created in FIG. 19, which form the stiff waffle sections 3210, 3212, the stiff waffle sections 3210, 3212 become easier to flex on the RF1 stack 1204 and the RF2 stack 1206. As such, the beam 3002 is able to contact the RF1 stack 1204 and the RF2 stack 1206 at a lower voltage.

Figure 33:
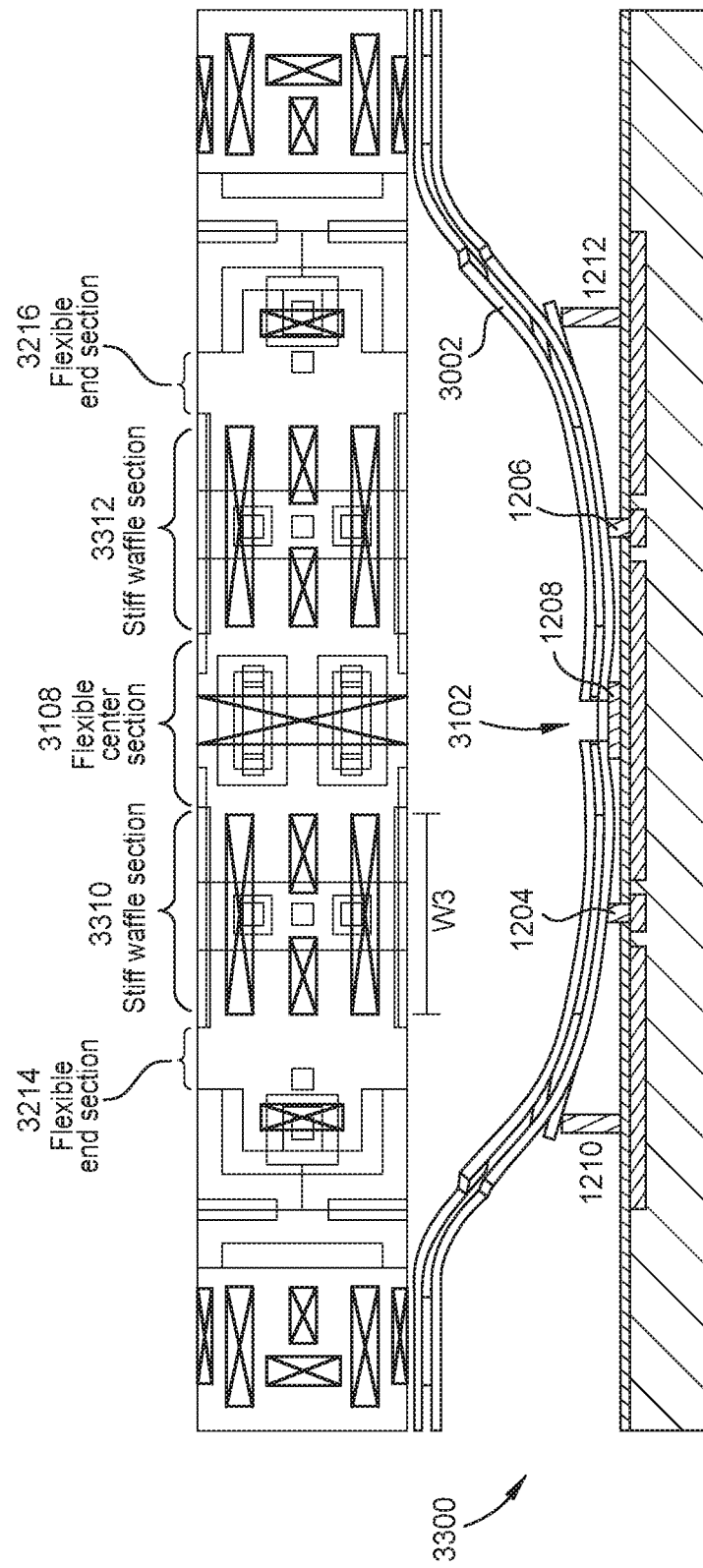
FIG. 33 is a cross-sectional view of a MEMS device having a hinged section and stiff waffle sections, according to yet another embodiment.

Referring to FIG. 33, yet another configuration of a MEMS switch 3300 is illustrated. The MEMS switch 3300 may be the same as the MEMS switch 3100 or MEMS switch 3200; however, the stiff waffle sections 3310, 3312 of the MEMS switch 3300 have a third width W3 that is less than the first width W1 of the stiff waffle sections 3110, 3112 of the MEMS switch 3100 and less than the second width W2 of the stiff waffle sections 3210, 3212 of the MEMS switch 3200. In this example embodiment, the stiff waffle sections 3310, 3312 have been pulled away from the center hinge section 3102 creating a wider (more compliant) flexible center section 3108. By further reducing the width of the plurality of links 1902 created in FIG. 19, which form the stiff waffle sections 3310, 3312, the stiff waffle sections 3310, 3312 become even easier to flex on the RF1 stack 1204 and the RF2 stack 1206. As such, the beam 3002 is able to contact the RF1 stack 1204 and the RF2 stack 1206 at an even lower voltage.

Figure 34:
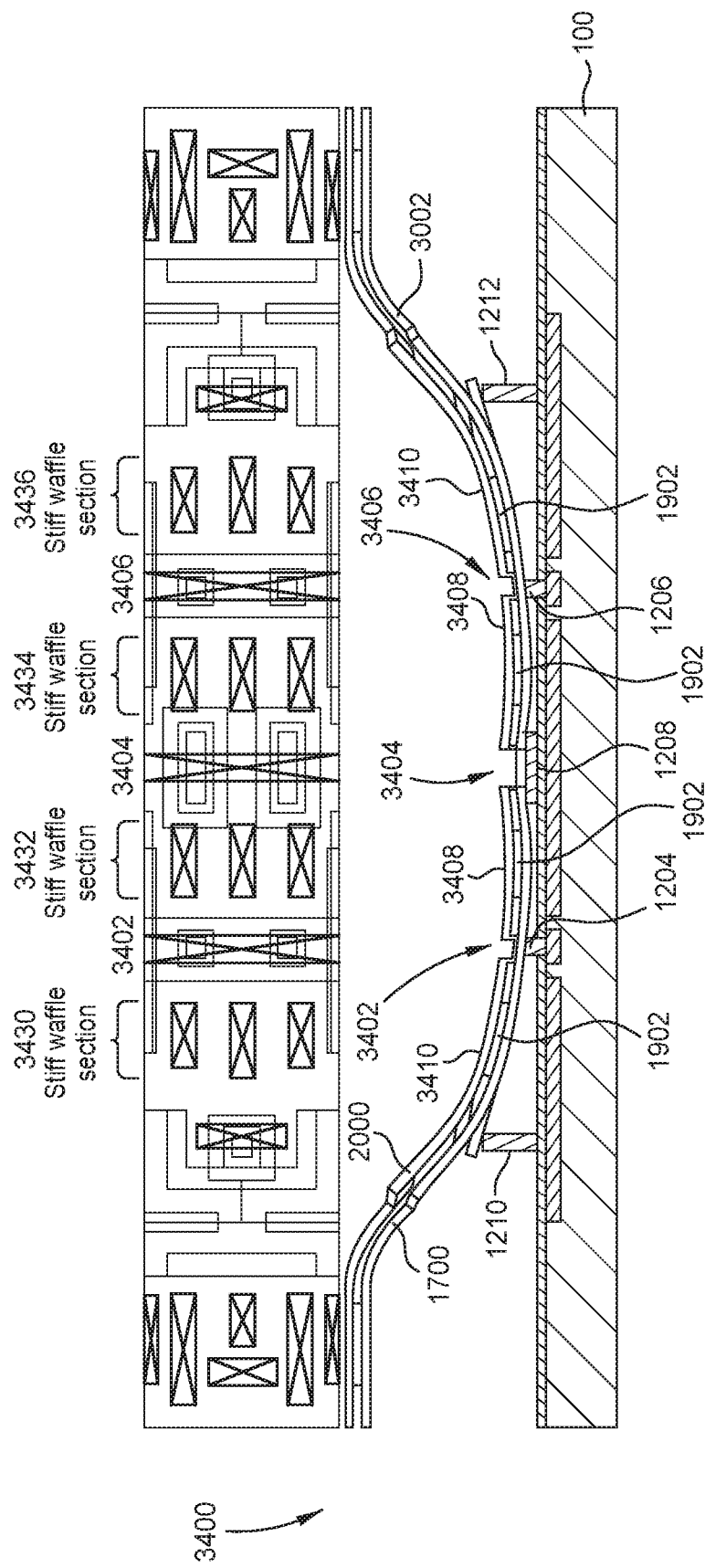
FIG. 34 is a cross-sectional view of a MEMS device having hinged sections and stiff waffle sections, according to another embodiment.

Referring to FIG. 34, yet another configuration of a MEMS switch 3400 is illustrated. The MEMS switch 3400 may be the same as the MEMS switch 3000 of FIG. 30; however, portions of the second spun layer 1800 disposed above the center stack 1208, the RF1 stack 1204, and RF2 stack 1206 are removed to form a first hinge section 3402, a second hinge section 3404, and a third hinge section 3406. The first hinge section 3402 is disposed above the RF1 stack 1204, the second hinge section 3404 is disposed above the center stack 1208, and the third hinge section 3406 is disposed above the RF2 stack 1206. Portions of the second spun layer 1800 may be removed via etching the second spun layer 1800 in FIG. 19.

A first stiff waffle section 3430 is disposed adjacent to the first hinge section 3402. A second stiff waffle section 3432 is disposed between the first hinge section 3402 and the second hinge section 3404. A third stiff waffle section 3434 is disposed between the second hinge section 3404 and the third hinge section 3406. A fourth stiff waffle section 3436 is disposed adjacent to the third hinge section 3406. Two RF conductors 106, 108 (not shown) are located under the beam 3002 recessed in the backplane 100, as shown in FIGS. 1-30.

The beam 3002, comprised of the bottom beam layer 1700 and the top beam layer 2000 linked together by a plurality of links 1902, is configured to move in an upwards and downwards direction. In FIG. 34, differing portions of the overall beam 3002 may act independently or hinged from other sections. For example, the center most sections 3408 of the beam 3002 disposed between the center stack 1208 and the RF1 and RF2 stacks 1204, 1206 may hinge and move independently from the outer sections 3410 disposed between the RF1 and RF2 stacks 1204, 1206 and the PB1 and PB2 stacks 1210, 1212, giving the beam 3002 more flexibility, which further ensures the RF1 and RF2 stacks 1204, 1206 are contacted last.

Figure 35:
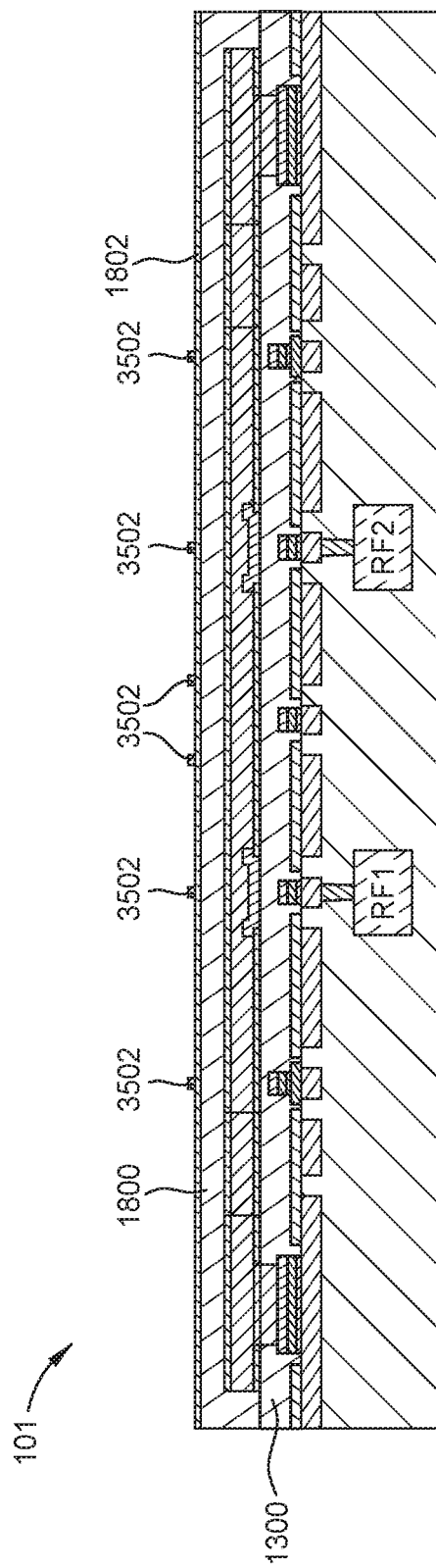
FIGS. 35-39 illustrate an alternative embodiment for forming a plurality of top bumps on a top beam layer of the MEMS device.

FIGS. 35-39 illustrate an alternative embodiment for forming a plurality of top bumps 3702 on the top beam layer 2000. After the second spun layer 1800 and the second dielectric layer 1802 are deposited in FIG. 18, the method may proceed to FIG. 35, rather than proceeding to FIG. 19. In FIG. 35, a plurality of first bumps 3502 are deposited on the second dielectric layer 1802. The plurality of first bumps 3502 may be deposited as a one layer through chemical vapor deposition, as a non-limiting embodiment, which is then patterned to form the plurality of first bumps 3502.

Figure 36:
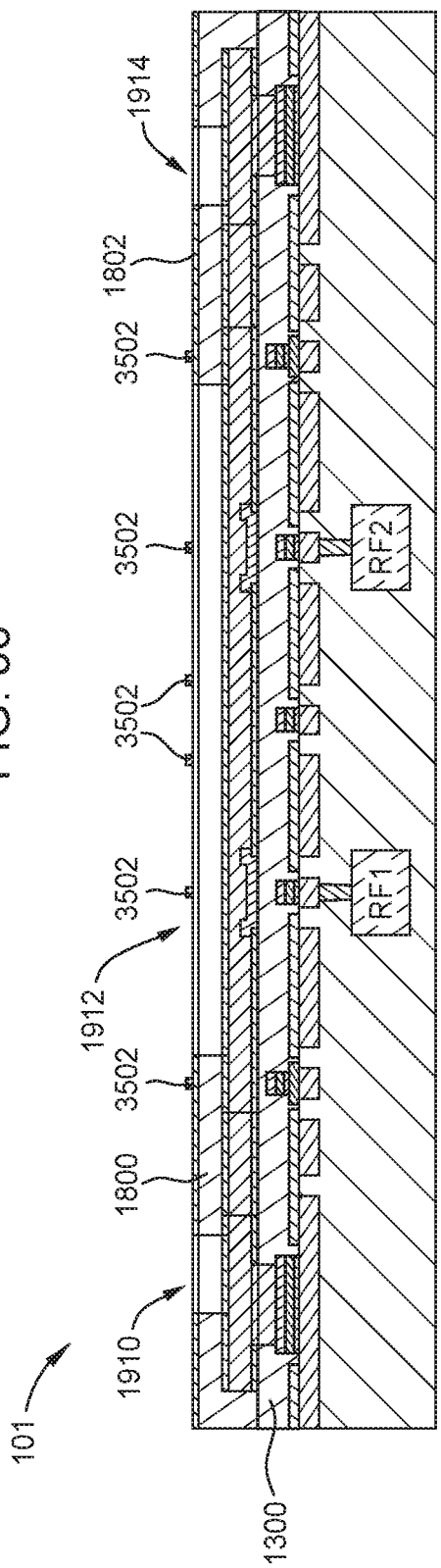
Figure 37:
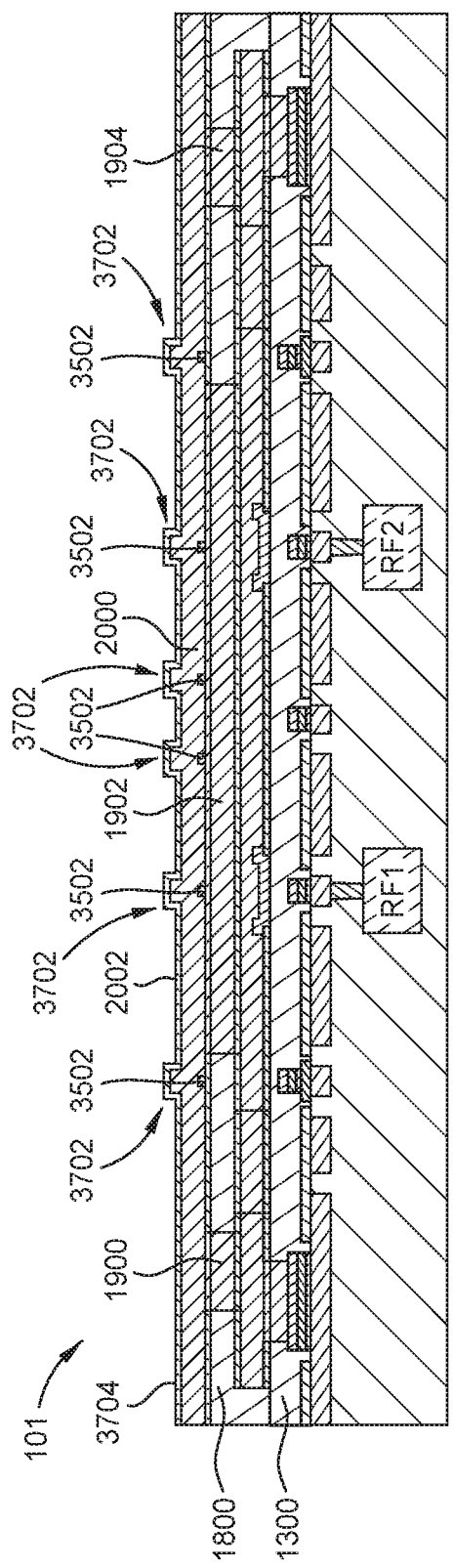

In FIG. 36, portions of the second spun layer 1800 and the second dielectric layer 1802 of the arrangement 101 of FIG. 35 are etched to form a plurality of vias 1910, 1912, 1914 that will form a plurality of links 1900, 1902, 1904 between a bottom beam (i.e., bottom beam layer 1700) and a top beam layer (i.e., top beam layer 2000 shown in FIG. 37).

In FIG. 37, a cross-sectional view of the arrangement 101 of FIG. 36 is illustrated having a deposited top beam layer

2000. A second additional beam layer 2002 may be deposited on the top beam layer 2000. The second additional beam layer 2002 may comprise a dielectric material. The plurality of first bumps 3502 formed in FIG. 35 translate through the top beam layer 2000 and the second additional beam layer 2002 to form a plurality of top bumps 3702 disposed on the top surface 3704 of the top beam layer 2000. The top beam layer 2000 and the second additional beam layer 2002 are also deposited within each of the etched vias 1910, 1912, 1914 in the second spun layer 1800 and on the sidewalls of these etched vias 1910, 1912, 1914, thereby creating the plurality of links 1900, 1902, 1904 between the bottom beam layer 1700 and top beam layer 2000.

Figure 38:
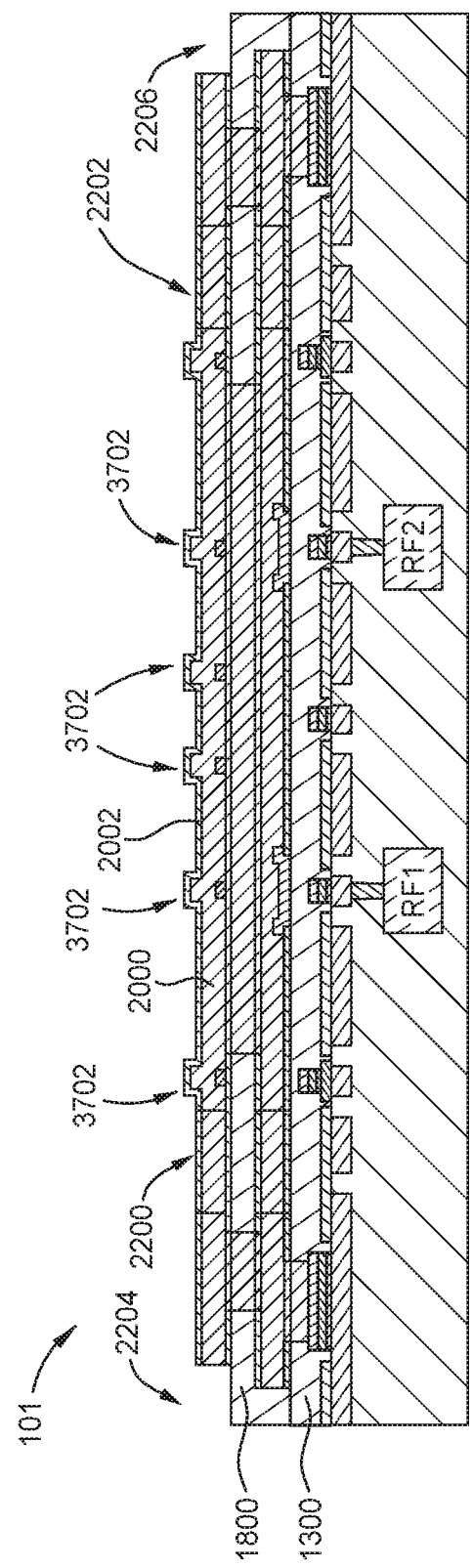

In FIG. 38, the top beam layer 2000 is etched at the ends 2204, 2206 of the arrangement 101 to remove a portion of the top beam layer 2000 from each end 2004, 2006, like described in FIG. 22 above. The top beam layer 2000 may be etched to have a shorter length than the bottom beam layer 1700 (i.e., a greater amount of material of the top beam layer 2000 may be removed than is removed from the bottom beam layer 1700). A third leg 2200 and a fourth leg 2202 are then formed in the top beam layer 2000. The third leg 2200 and the fourth leg 2202 may be disposed above or aligned with the first leg 1702 and the second leg 1704.

Figure 39:
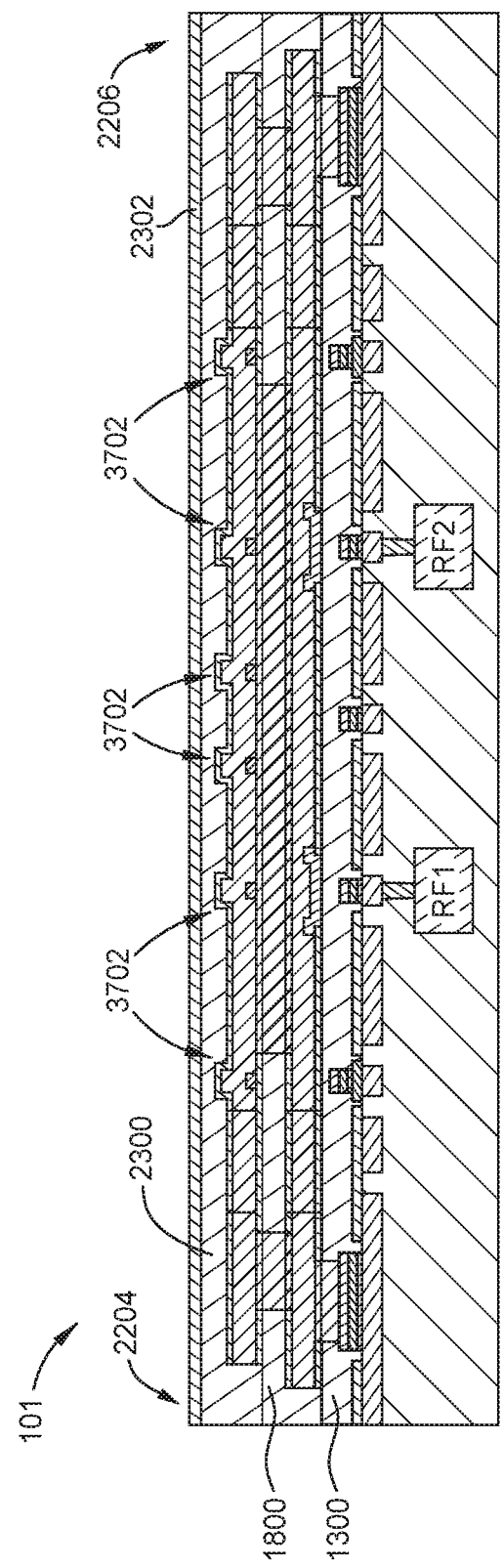

In FIG. 39, a third spun layer 2300 and third dielectric layer 2302 are deposited over the plurality of top bumps 3702 and the top beam layer 2000 of the arrangement 101 of FIG. 38, like described in FIG. 23 above. The third spun layer 2300 may be a sacrificial layer. The third dielectric layer 2302 may be a silicon dioxide layer. The third spun layer 2300 may comprise the same materials as the first spun layer 1300 and/or the second spun layer 1800, and the third dielectric layer 2302 may comprise the same material as the first dielectric layer 1302 and/or the second dielectric layer 1802. The third dielectric layer 2302 may have a greater thickness than the first dielectric layer 1302 and/or the second dielectric layer 1802. The third spun layer 2300 is deposited over each end 2004, 2006 such that portions of the third spun layer 2300 contact portions of the second spun layer 1800.

Follow FIG. 39, the method proceeds to FIG. 24 above. Thus, FIGS. 19-23 illustrate a first embodiment for forming a plurality of bumps 2100 on the top beam layer 2000, and FIGS. 35-39 illustrate a second, alternative embodiment for forming a plurality of top bumps 3702 on the top beam layer 2000. The plurality of top bumps 3702 may be used to contact the third dielectric layer 2302 disposed above the top beam layer 2000 to prevent the top beam layer 2000 from directly contacting or colliding with the third dielectric layer 2302.

Like the bumps 2100, each of the top bumps 3702 may have a height extending above the top beam layer 2000 of about 500 angstroms to about 700 angstroms, such as about 600 angstroms, and a width of about 0.5 µm to about 1 µm. Each of the top bumps 3702 may have the same height and/or width, or each of the top bumps 3702 may have varying heights and/or widths. Additionally, each of the top bumps 3702 may be spaced from an adjacent top bump 3702 by a distance between about 4 microns to about 6 microns, and the spacing between each top bump 3702 may vary. For example, six top bumps 3702 are shown in FIGS. 35-39.

Furthermore, one or more additional rows of top bumps 3702 (shown in FIGS. 31-33) may be disposed on the top beam layer 2000, either aligned or misaligned with the row top bumps 3702 shown in FIGS. 35-39. In such an embodiment, each row of top bumps 3702 may be spaced from an adjacent row of top bumps 3702 by a distance of about 3 microns. Moreover, while six top bumps 3702 are shown in FIGS. 35-29, any number of top bumps 3702 may be disposed on the top beam layer 2000 and/or within each row, and the number of top bumps 3702 is not intended to be limiting.

Using the above described method to form a MEMS device or switch results in a MEMS device having increased flexibility, and allows a beam of the MEMS device to be fully supported before contacting the RF conductors. By forming at least two stacks having a greater height than the RF stacks, the beam of the MEMS device is prevented from contacting the RF stacks with a great amount of force. Furthermore, by including one or more hinge sections in the beam of the MEMS device, portions of the beam may move independently from one another to further ensure the RF stacks are contacted last with a small amount of force.

Additionally, the plurality of bumps disposed on the top layer of the beam prevents the beam from directly contacting or colliding with a layer disposed between the beam and an upper electrode. By increasing a thickness of each of the plurality of bumps and by decreasing the spaced disposed between the beam and the pull up electrode, ringing concerns of the beam are reduced or eliminated.

As will be understood, in instances described above as an "etch", different types of etching may occur, as applicable. In some embodiments, either a "wet" etch or a "dry" etch may be performed. Etching and other process steps may include variations of the temperature under which the materials are exposed. In some embodiments, for example, an elevation in temperature may increase the amount of deposition of material. Deposition steps may be accomplished through chemical vapor deposition or physical vapor deposition as non-limiting embodiments. In method steps related to spin or spun on products, it will be understood that such products may come from doped solutions, as a non-limiting embodiment.

In the embodiments disclosed above, a method for making a microelectromechanical device is disclosed. The devices may be used in many types of application, such as in wireless communications as well as consumer products. The device manufacturing methods have a small footprint and as such, the methods and apparatus provide advantages over conventional electrical arrangements. The resulting microelectromechanical devices can be small rendering their use in a variety of products.

The method provided allows for production/manufacture of microelectromechanical devices such that the production has a high yield and low defect rate. As the resulting microelectromechanical devices are small in scale, the amount of power needed for switching purposes is minimal, providing power saving advantages for products that use such devices. The methods themselves are highly and reliably repeatable thereby allowing for a high quality factor of devices production. Additionally, the methods provided can be performed in "batch" form, thereby allowing a multitude of devices to be made simultaneously.

The method used to produce the MEMS devices and the design of the MEMS devices itself prevent failure modes of conventional MEMS devices by limiting unwanted beam contact in areas of the switch that are not intended.

Those skilled in the art will recognize improvements and modifications to the preferred embodiments of the present disclosure. All such improvements and modifications are considered within the scope of the concepts disclosed herein and the claims that follow.

What is claimed is:

1. A method for forming a microelectromechanical device, comprising:
   forming one or more bottom electrodes on a backplane comprising at least two RF conductors;
   depositing a bottom dielectric layer over the backplane and the one or more bottom electrodes;
   etching one or more openings in the bottom dielectric layer;
   depositing a first base layer and a second base layer onto the one or more openings in the bottom dielectric layer;
   depositing a plurality of stacks on at least the first and second base layers, above the at least two RF conductors, and between the at least two RF conductors;
   depositing a first spun layer over an entire surface of all of the layers previously deposited;
   depositing a first dielectric layer on the first spun layer;
   removing at least two areas of the first dielectric layer disposed above the at least two RF conductors;
   depositing at least two beam contact layers on the at least two removed areas of the first dielectric layer;
   depositing a bottom beam layer over the at least two beam contact layers and the first dielectric layer;
   depositing a second spun layer on the bottom beam layer;
   depositing a top beam layer above the second spun layer;
   depositing a third spun layer over the top beam layer;
   depositing a partial cavity layer above the third spun layer;
   depositing a roof dielectric layer over the partial cavity layer;
   etching one or more release holes through the roof dielectric layer;
   removing the first spun layer, the second spun layer, and the third spun layer through the one or more release holes; and
   depositing a seal layer above the roof dielectric layer and within the one or more release holes.

2. The method of claim 1, further comprising:
   depositing an oxide layer over the one or more bottom electrodes prior to depositing the bottom dielectric layer; and
   etching one or more second portions in the bottom dielectric layer prior to depositing the plurality of stacks.

3. The method of claim 2, wherein depositing the plurality of stacks comprises depositing a stack onto each of the etched one or more second portions of the bottom dielectric layer.

4. The method of claim 1, further comprising:
   forming a plurality of vias in the second spun layer prior to depositing the top beam layer; and
   depositing the top beam layer within the plurality of vias to form a plurality of links between the top beam layer and the bottom beam layer.

5. The method of claim 1, wherein the etching of the bottom dielectric layer is a timed etch process.

6. The method of claim 1, wherein each of the plurality of stacks comprises more than one layer.

7. The method of claim 6, wherein each of the plurality of stacks includes at least one layer of ruthenium.

8. The method of claim 6, wherein each of the plurality of stacks includes a layer of titanium nitride.

9. The method of claim 1, further comprising:
   etching a portion of a top layer of each of the plurality of stacks and a portion of the beam contact layer after removing the first spun layer, the second spun layer, and the third spun layer.

10. A microelectromechanical device, comprising:
    a backplane comprising at least two RF conductors;
    a plurality of bottom electrodes disposed on the backplane;
    a bottom dielectric layer disposed on the plurality of bottom electrodes, the bottom dielectric layer comprising at least two openings;
    a first base layer and a second base layer disposed on at least two openings of the bottom dielectric layer;
    a first stack disposed on the first base layer, the first stack having a first height;
    a second stack disposed on the second base layer, the second stack having the first height;
    at least two RF stacks disposed above the at least two RF conductors, the at least two RF stacks each having a second height less than the first height of the first and second stacks;
    a center stack disposed between the at least two RF stacks, the center stack having the second height;
    a beam contact layer disposed above the at least two RF stacks;
    a bottom beam layer disposed over the beam contact layer;
    a top beam layer disposed above the bottom beam layer;
    a partial cavity layer disposed above the top beam layer; and
    a seal layer disposed above the partial cavity layer.

11. The microelectromechanical device of claim 10, wherein a portion of the partial cavity layer forms a top electrode.

12. The microelectromechanical device of claim 10, wherein the center stack is configured to contact the bottom beam layer prior to the first stack, the second stack and the at least two RF stacks contacting the bottom beam layer.

13. The microelectromechanical device of claim 10, wherein at least a layer of each of the stacks comprises ruthenium.

14. The microelectromechanical device of claim 10, wherein the first stack and the second stack are configured to contact the bottom beam layer prior to the at least two RF stacks contacting the bottom beam layer.

15. The microelectromechanical device of claim 10, further comprising:
    a plurality of links disposed between the bottom beam layer and the top beam layer.

* * * * *